(12) United States Patent
Delos et al.

(10) Patent No.: US 11,804,804 B2
(45) Date of Patent: Oct. 31, 2023

(54) PROGRAMMABLE HARMONIC REJECTION MIXER (HRM)/SUBHARMONIC MIXER (SHM) TOPOLOGY

(71) Applicant: Analog Devices, Inc., Wilmington, MA (US)

(72) Inventors: Peter Delos, Greensboro, NC (US); Ed Balboni, Littleton, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/474,374

(22) Filed: Sep. 14, 2021

(65) Prior Publication Data

US 2022/0085762 A1  Mar. 17, 2022

Related U.S. Application Data

(60) Provisional application No. 63/077,943, filed on Sep. 14, 2020.

(51) Int. Cl.
*H03D 7/14* (2006.01)

(52) U.S. Cl.
CPC ......... *H03D 7/1475* (2013.01); *H03D 7/1458* (2013.01); *H03D 7/1466* (2013.01); *H03D 7/1483* (2013.01); *H03D 2200/0074* (2013.01); *H03D 2200/0086* (2013.01)

(58) Field of Classification Search
CPC ...... H03D 7/14; H03D 7/1425; H03D 7/1491; H03D 7/1458; H03D 7/1466; H03D 7/1475; H03D 7/1483; H03D 2200/0074; H03D 2200/0086
See application file for complete search history.

(56) References Cited

U.S. PATENT DOCUMENTS

| | | | |
|---|---|---|---|
| 6,810,242 B2 | 10/2004 | Molnar et al. | |
| 7,130,604 B1 | 10/2006 | Wong et al. | |
| 2015/0094004 A1* | 4/2015 | Vora | H03D 7/1466 455/114.1 |
| 2016/0261298 A1 | 9/2016 | Seendripu et al. | |
| 2021/0281218 A1* | 9/2021 | Li | H03D 7/1441 |

* cited by examiner

*Primary Examiner* — Long Nguyen
(74) *Attorney, Agent, or Firm* — Schwegman Lundberg & Woessner, P.A.

(57) ABSTRACT

One embodiment is a reconfigurable mixer topology for selectively implementing one of a harmonic rejection mixer (HRM) and a subharmonic mixer (SHM), the reconfigurable mixer topology comprising a mixer core comprising a plurality of differential mixers each having a first clock input and a second clock input; a clock generator for generating a plurality of clock signals each having a different phase; and a clock distributor for distributing the plurality of clock signals to the first and second clock inputs of the differential mixers in accordance with a designated operation of the reconfigurable mixer as an HRM or an SHM.

20 Claims, 34 Drawing Sheets

700
State 1
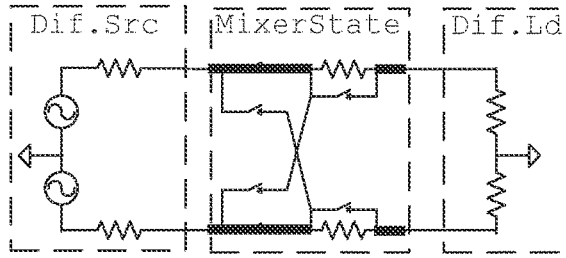
State 2
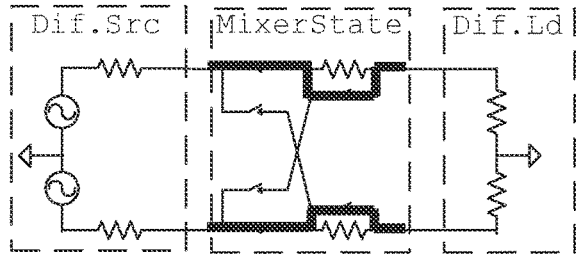
State 3
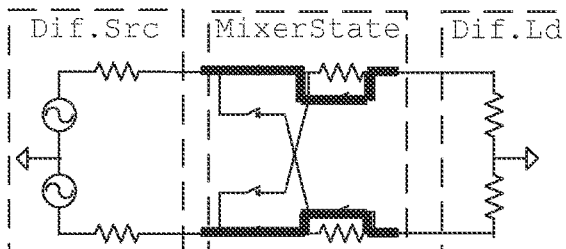
State 4
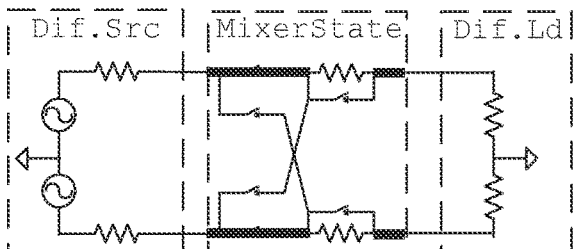
State 5
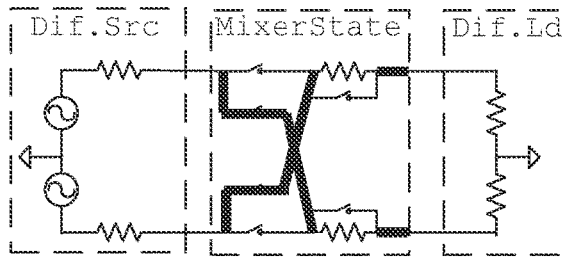
State 6
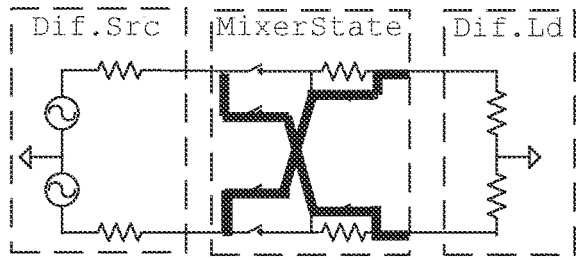
State 7
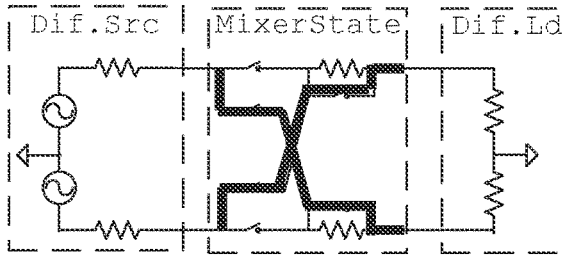
State 8
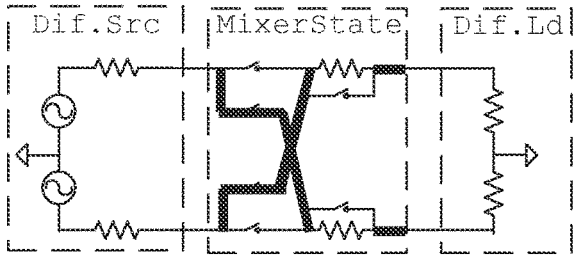
FIG.7A 800
State 1
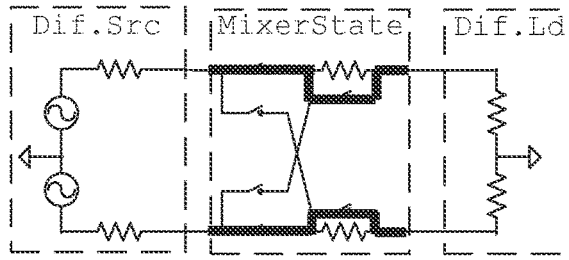
State 2
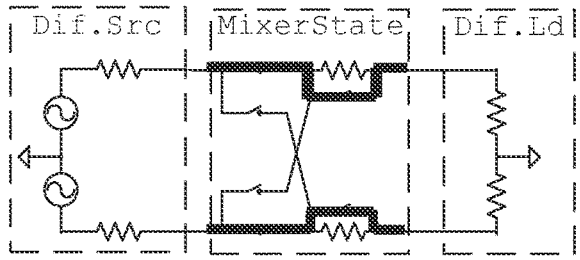
State 3
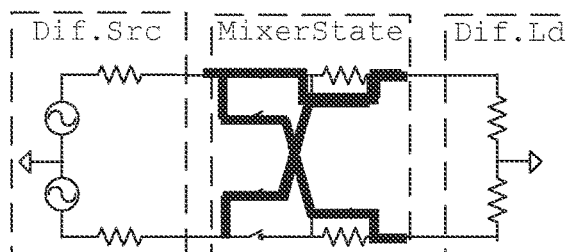
State 4
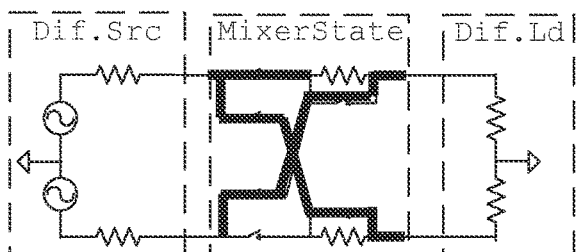
State 5
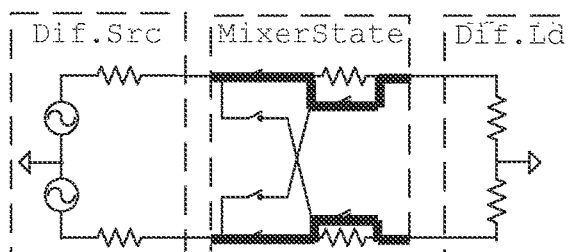
State 6
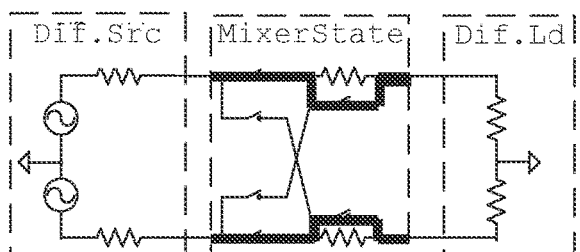
State 7
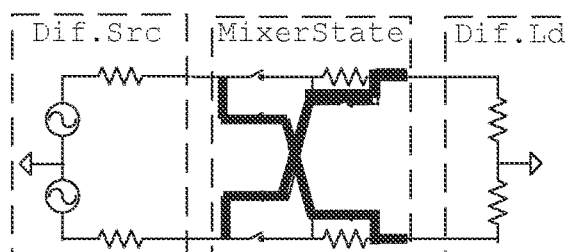
State 8
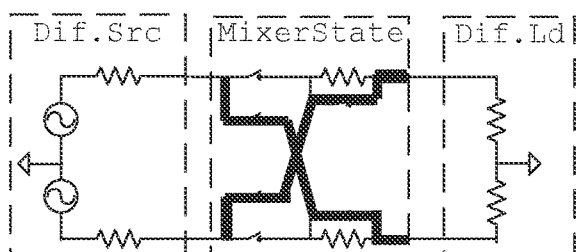
FIG.8A 900
State 1             State 2
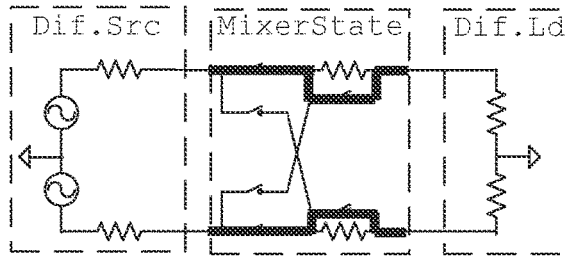 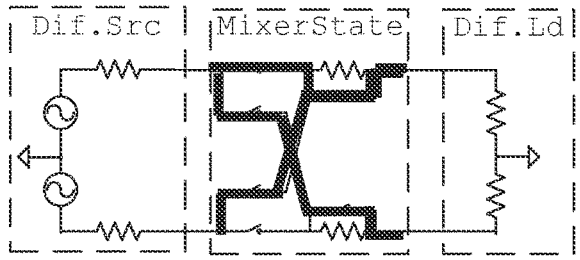
State 3             State 4
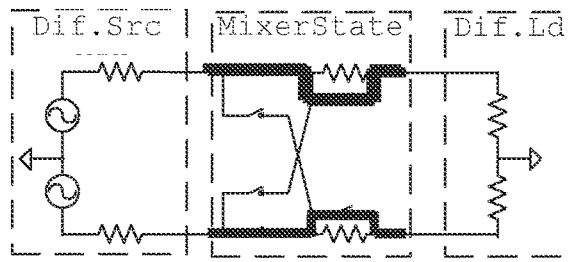 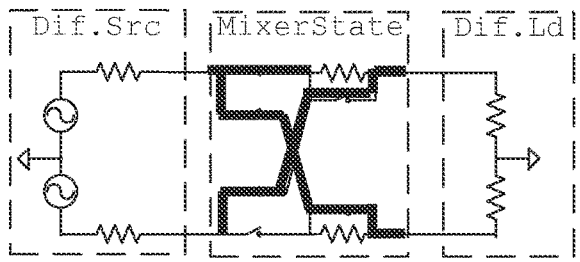
State 5             State 6
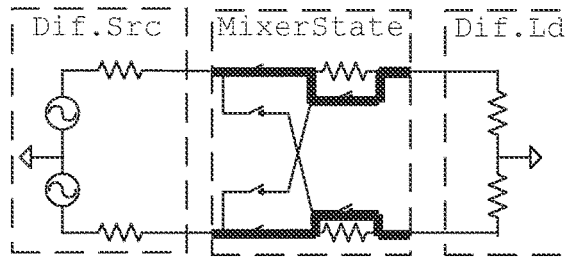 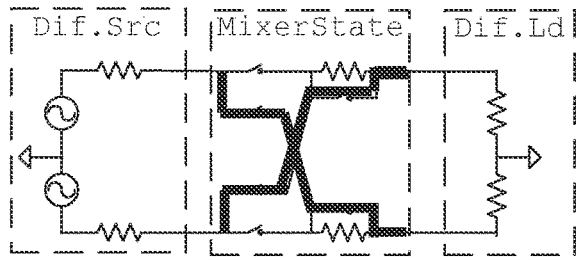
State 7             State 8
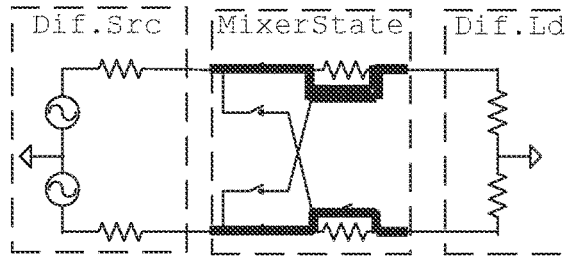 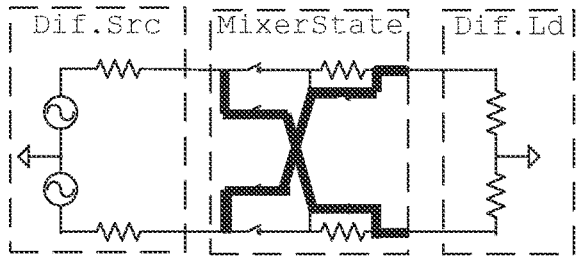
FIG. 9A

| Input Clocks | | HRM | | x2 SHM | | x4 SHM | |
|---|---|---|---|---|---|---|---|
| From ClkGen | phase | Mixer | Dist Out | Mixer | Dist Out | Mixer | Dist Out |
| clk0 | 0 | mx0:clk1 | clkout0 | mx0:clk1 | clkout0 | mx0:clk1 | clkout0 |
| clk1 | 45 | mx1:clk1 | clkout1 | mx1:clk1 | clkout1 | mx2:clk2 | clkout6 |
| clk2 | 90 | mx2:clk1 | clkout2 | mx0:clk2 | clkout4 | mx1:clk1 | clkout1 |
| clk3 | 135 | mx3:clk1 | clkout3 | mx1:clk2 | clkout5 | mx3:clk2 | clkout7 |
| clk4 | 180 | mx0:clk2 | clkout4 | mx2:clk1 | clkout2 | mx2:clk1 | clkout2 |
| clk5 | 225 | mx1:clk2 | clkout5 | mx3:clk1 | clkout3 | mx0:clk2 | clkout4 |
| clk6 | 270 | mx2:clk2 | clkout6 | mx2:clk2 | clkout6 | mx3:clk1 | clkout3 |
| clk7 | 315 | mx3:clk2 | clkout7 | mx3:clk2 | clkout7 | mx1:clk2 | clkout5 |

PROGRAMMABLE HARMONIC REJECTION MIXER (HRM)/SUBHARMONIC MIXER (SHM) TOPOLOGY

CROSS REFERENCE TO RELATED APPLICATIONS

This application claims the benefit of and priority from U.S. patent application Ser. No. 63/077,943, filed Sep. 14, 2020, titled "PROGRAMMABLE HARMONIC REJECTION MIXER (HRM)/SUBHARMONIC MIXER (SHM) TOPOLOGY" the disclosure of which is hereby incorporated by reference herein in its entirety.

TECHNICAL FIELD OF THE DISCLOSURE

This disclosure relates generally to the field of frequency mixers and, more particularly, to a programmable harmonic rejection mixer (HRM)/subharmonic mixer (SHM) topology.

BACKGROUND

A radio frequency (RF) mixer in its basic form is a 3-port component that uses a nonlinear or time-varying element to produce an output signal containing the sum and difference frequencies of two input signals. HRMs and SHMs are examples of RF mixers. HRMs are known topologies for reducing the harmonic content of a square wave local oscillator (LO) signal. SHMs are known topologies for allowing emphasis of the harmonic content of the LO to create an effective LO signal at a frequency multiple of the LO input frequency.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 7A-7C illustrate operation of a reconfigurable HRM/SRM topology for implementing an HRM in accordance with embodiments described herein;

FIGS. 8A-8C illustrate operation of a reconfigurable HRM/SRM topology for implementing an x2 SHM in accordance with embodiments described herein;

FIGS. 9A-9C illustrate operation of a reconfigurable HRM/SRM topology for implementing an x4 SHM in accordance with embodiments described herein;

FIGS. 15-16 illustrate an example of a clock distributor in accordance with embodiments described herein;

DESCRIPTION OF EXAMPLE EMBODIMENTS OF THE DISCLOSURE

Overview

Figure 1A:
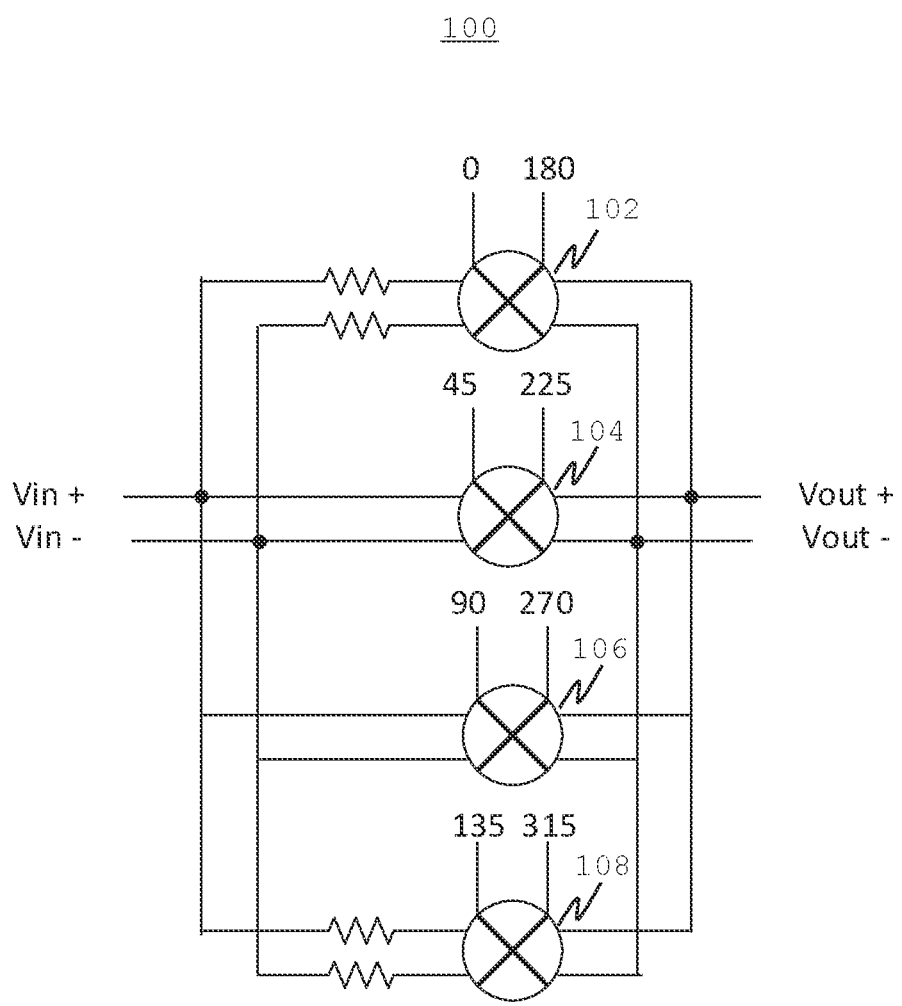
FIGS. 1A-1C illustrates a configuration of a resistive HRM mixer core in accordance with embodiments described herein.

The systems, methods and devices of this disclosure each have several innovative aspects, no single one of which is solely responsible for all of the desirable attributes disclosed herein. Details of one or more implementations of the subject matter described herein are set forth below and the accompanying drawings.

Embodiments described herein provide a mixer topology architecture that is selectively programmable to operate as an HRM or a SHM.

One known type of HRM is referred to as a resistive HRM. An issue with HRMs, including resistive HRMs, is the associated upper frequency limit due to the polyphase LO required for the multiple parallel passive mixers. In accordance with features of embodiments described herein, by bypassing the resistors and reprogramming the phase sequence used in the resistive HRM topology, an SHM can be implemented. Some of the various options reuse the same clock phases used by the HRM to create an SHM, simplifying the polyphase LO generation.

The programmable option described herein may enable an ultra-wideband mixer topology, in which an HRM can be deployed for use at low frequency (when rejection of the harmonics is needed), then reconfigured to be deployed for use as an SHM at higher frequency (when rejection of harmonics is no longer an issue but rather generation of a higher frequency LO is).

The following detailed description presents various descriptions of specific certain embodiments. However, the innovations described herein can be embodied in a multitude of different ways, for example, as defined and covered by the claims and/or select examples. In the following description, reference is made to the drawings, where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The following disclosure describes various illustrative embodiments and examples for implementing the features and functionality of the present disclosure. While particular components, arrangements, and/or features are described below in connection with various example embodiments, these are merely examples used to simplify the present disclosure and are not intended to be limiting. It will of course be appreciated that in the development of any actual embodiment, numerous implementation-specific decisions must be made to achieve the developer's specific goals, including compliance with system, business, and/or legal constraints, which may vary from one implementation to another. Moreover, it will be appreciated that, while such a development effort might be complex and time-consuming, it would nevertheless be a routine undertaking for those of ordinary skill in the art having the benefit of this disclosure.

In the present disclosure, if used, the terms "substantially," "approximately," "about," etc., may be used to generally refer to being within +/−20% of a target value, e.g., within +/−10% of a target value, based on the context of a particular value as described herein or as known in the art. For the purposes of the present disclosure, the phrase "A and/or B" or notation "A/B" means (A), (B), or (A and B). For the purposes of the present disclosure, the phrase "A, B, and/or C" or notation "A/B/C" mean (A), (B), (C), (A and B), (A and C), (B and C), or (A, B, and C).

Other features and advantages of the disclosure will be apparent from the following description and the claims.

Example of a Resistive HRM

Figure 1B:
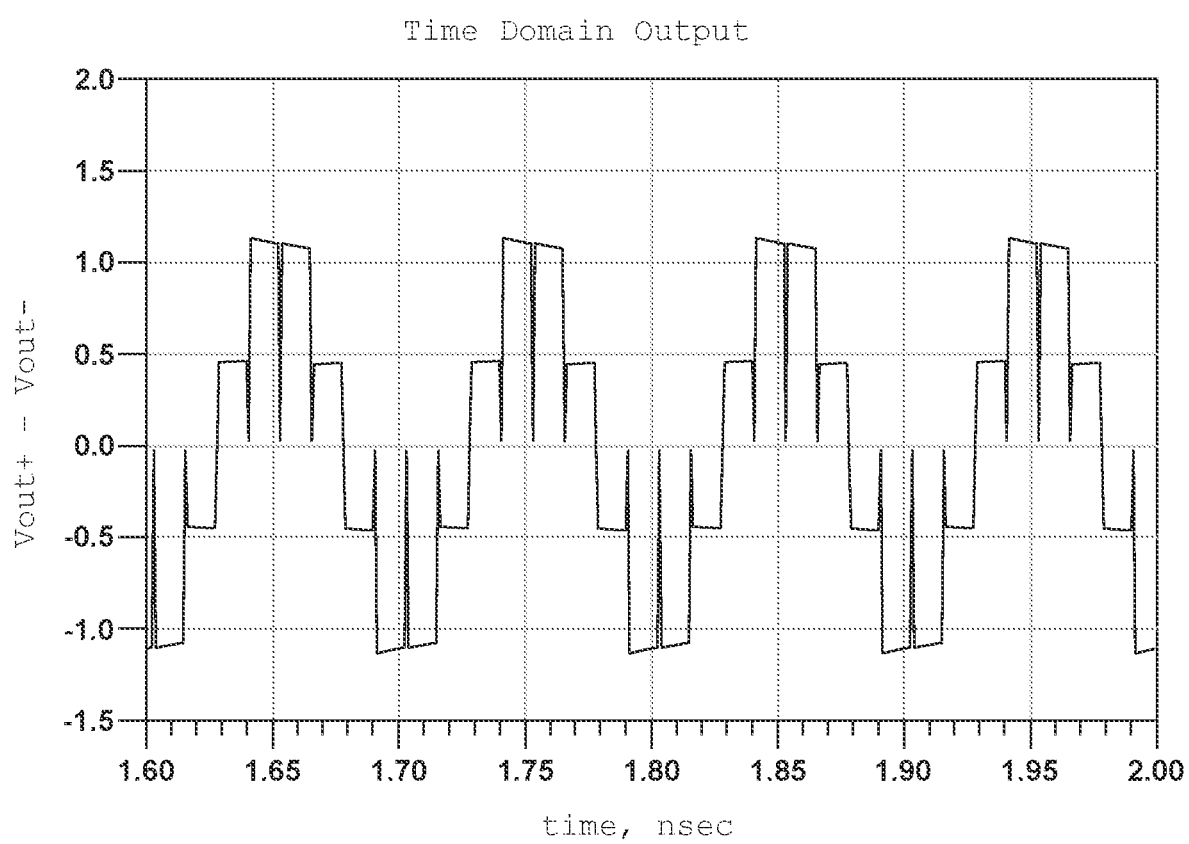
Figure 1C:
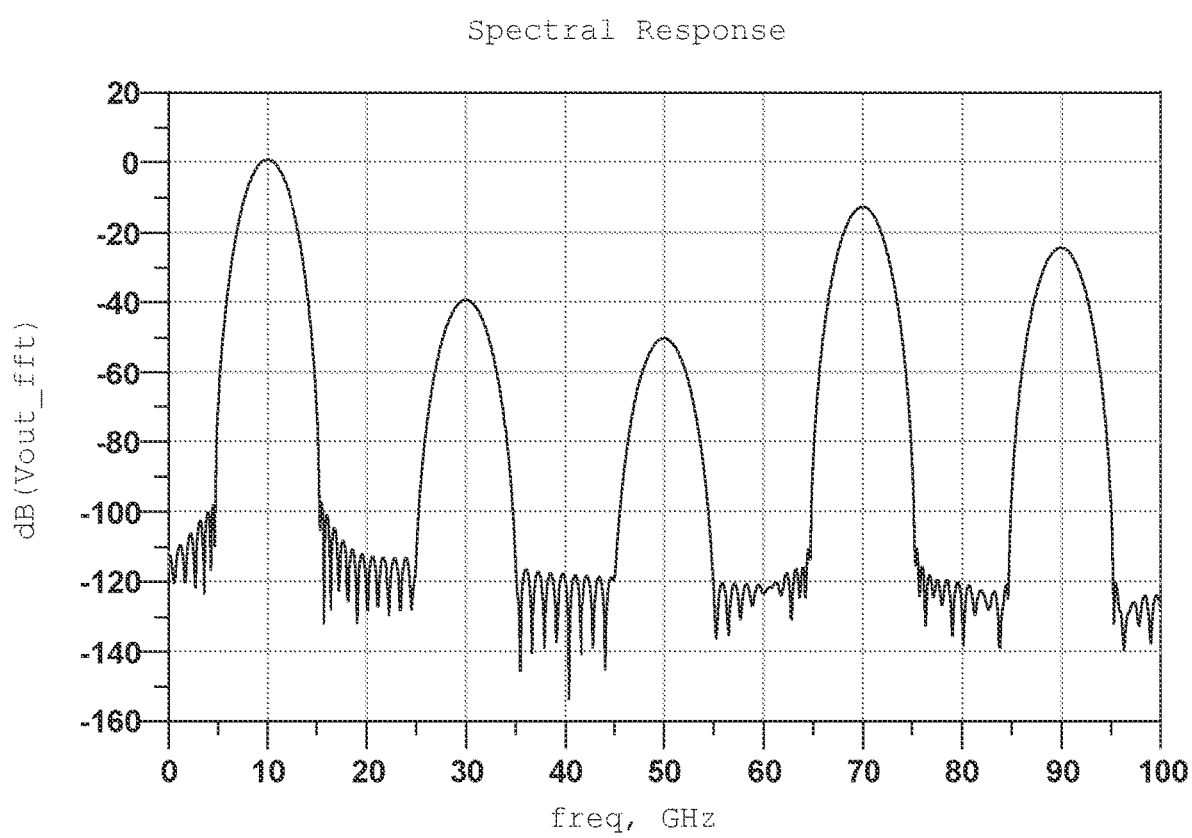

FIGS. 1A-1C illustrate various aspects of a resistive HRM in accordance with embodiments described herein. In FIG. 1A a resistive HRM 100 is shown. The resistive HRM may include a mixer core including four differential mixers 102-108, each having a differential voltage input, a differential voltage output, and two clock inputs for receiving clock signals. The clock inputs of the differential mixers may be programmed as shown, with the first differential mixer 102 receiving 0 and 180 degree phases, respectively, the second differential mixer 104 receiving 45 and 225 degree phases, respectively, the third differential mixer 106 receiving 90 and 270 degree phases, respectively, and the fourth differential mixer 108 receiving 135 and 315 degree phases, respectively. For each of the differential mixers 102-108 the clock signals distributed to the first and second clock inputs thereof are 180 degrees out of phase from one another. The differential voltage inputs to the first differential mixer 102 and the fourth differential mixer 108 are input via a resistor.

FIG. 1B illustrates an example time domain output of a direct current (DC) model of the HRM of FIG. 1A, in which the input to the differential mixer is DC and the frequency of the LO is 10 GHz to aid in illustration of the response of the HRM. Along the y-axis the DC output of the HRM is shown expressed as the positive voltage output (Vout+) minus the negative voltage output (Vout−). FIG. 1C illustrate a spectral response of the DC model of the HRM of FIG. 1A in the form of a fast Fourier transform of the output voltage shown in FIG. 1B. Along the y-axis the amplitude in decibel (dB) of the output signal is shown.

Example of a x2 SHM

Figure 2A:
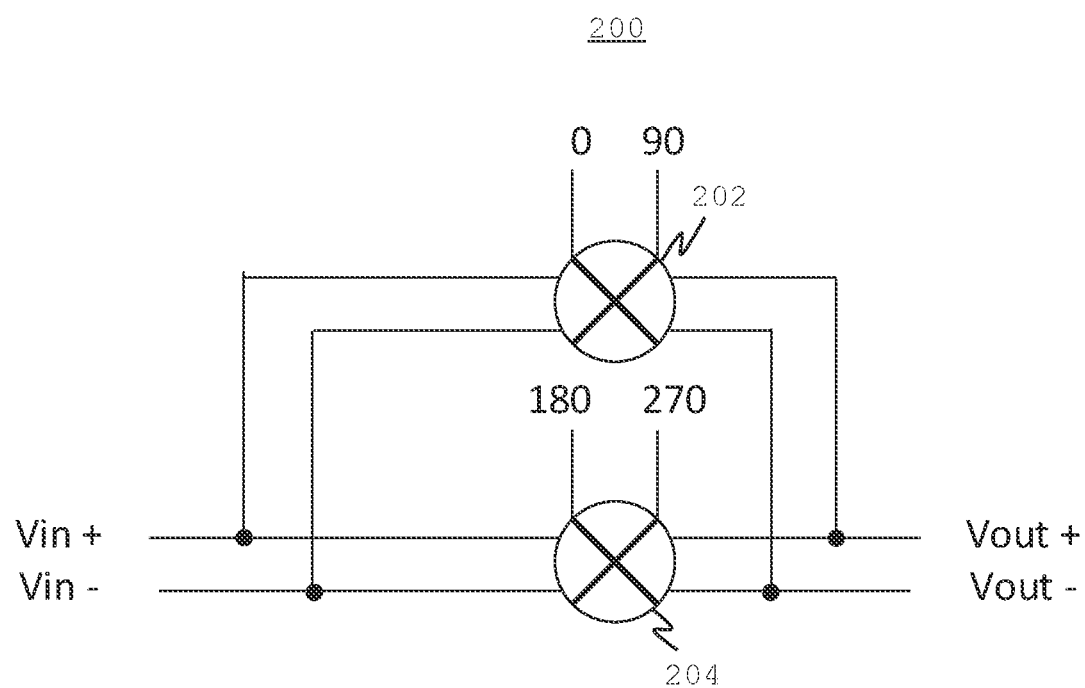
FIGS. 2A-2C illustrate a configuration of a x2 SHM mixer core in accordance with embodiments described herein.
Figure 2B:
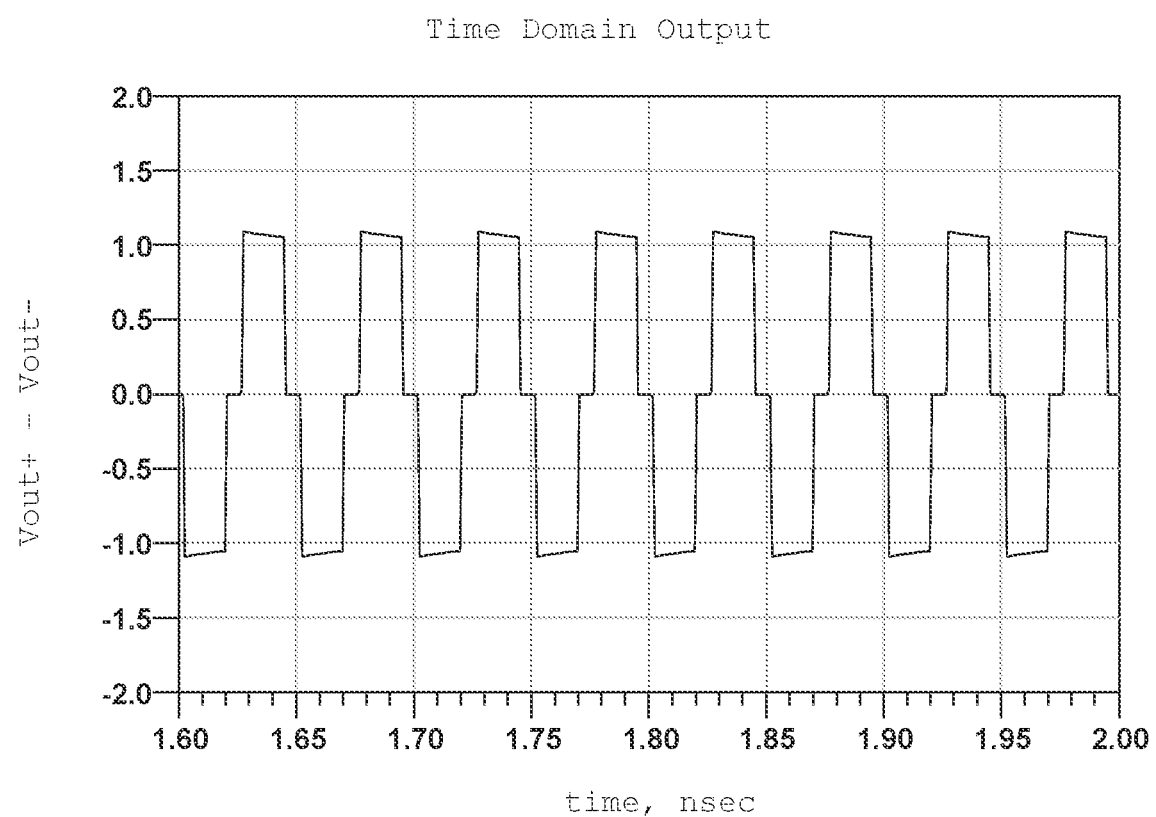
Figure 2C:
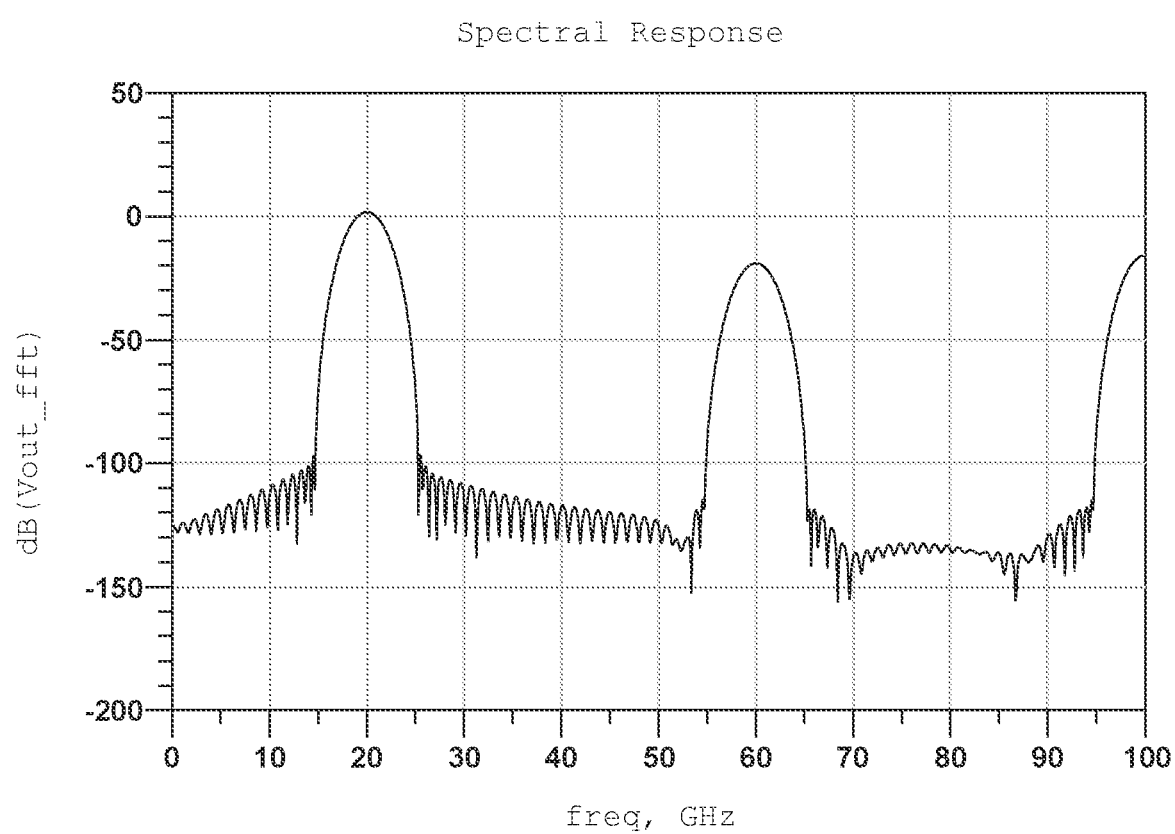

FIGS. 2A-2C illustrate a mixer core configured as an x2 SHM 200. As shown in FIG. 2A, only the center two of the differential mixers of the mixer core of the HRM topology of FIG. 1A are used. No weighting is deployed, the resistors of the HRM 100 are bypassed. The first and second clock inputs of the differential mixers may be programmed as shown, with the first differential mixer 202 receiving 0 and 90 degree phases, respectively, and the second differential mixer 204 receiving 180 and 270 degree phases, respectively. The clock signals distributed to the first and second clock inputs of the first differential mixer 202 and the second differential mixer 204, respectively, are 90 degrees out of phase from one another.

FIG. 2B illustrates an example time domain output of a DC model of the x2 SHM 200 of FIG. 2A, in which the input to the differential mixer is DC and the frequency of the input LO is 10 GHz to aid in illustration of the response of the differential mixer to generate a 20 GHz LO. Along the y-axis the DC output of the x2 SHM 200 is shown expressed as the positive voltage output (Vout+) minus the negative voltage output (Vout−). FIG. 2C illustrate a spectral response of the DC model of the x2 SHM 200 of FIG. 2A in the form of a fast Fourier transform of the output voltage shown in FIG. 2B. Along the y-axis the amplitude in decibel (dB) of the output signal is shown. Odd harmonics of the x2 may also be created.

Example of a x3 SHM

Figure 3A:
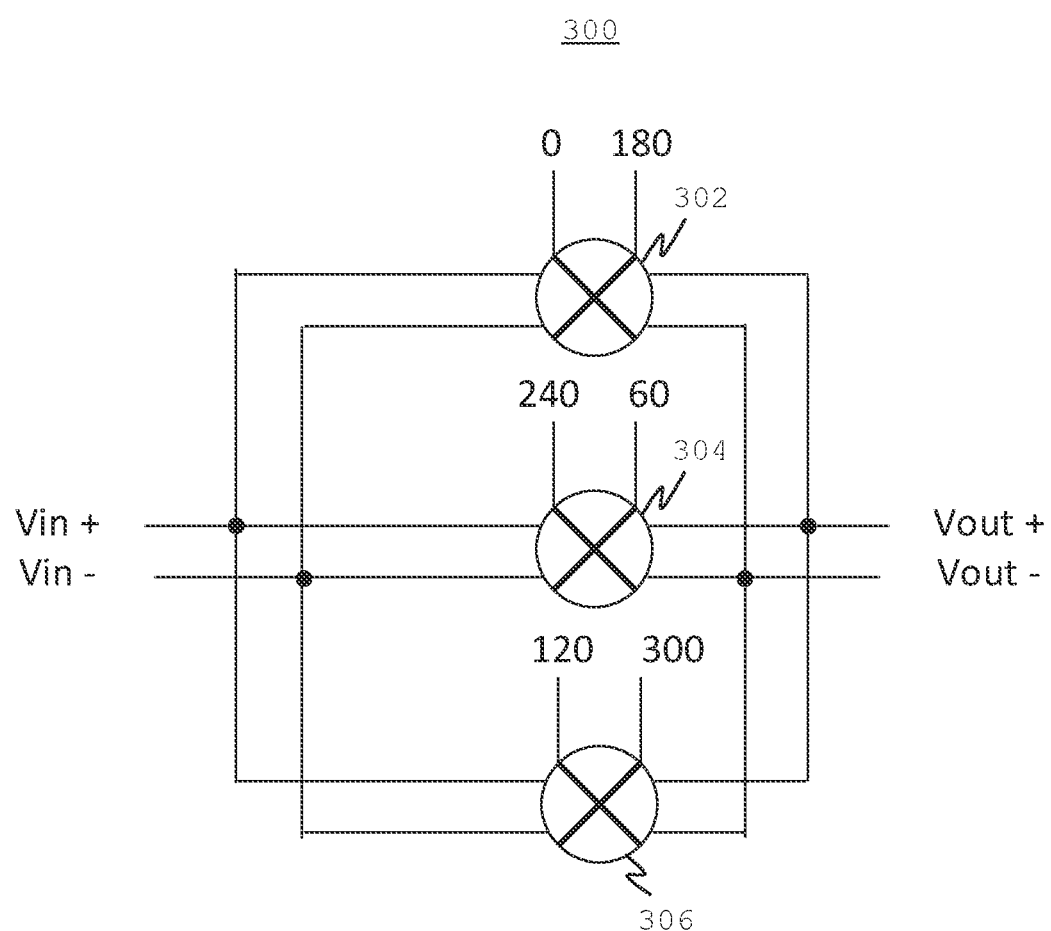
FIGS. 3A-3C illustrate a configuration of a x3 SHM mixer core in accordance with embodiments described herein.
Figure 3B:
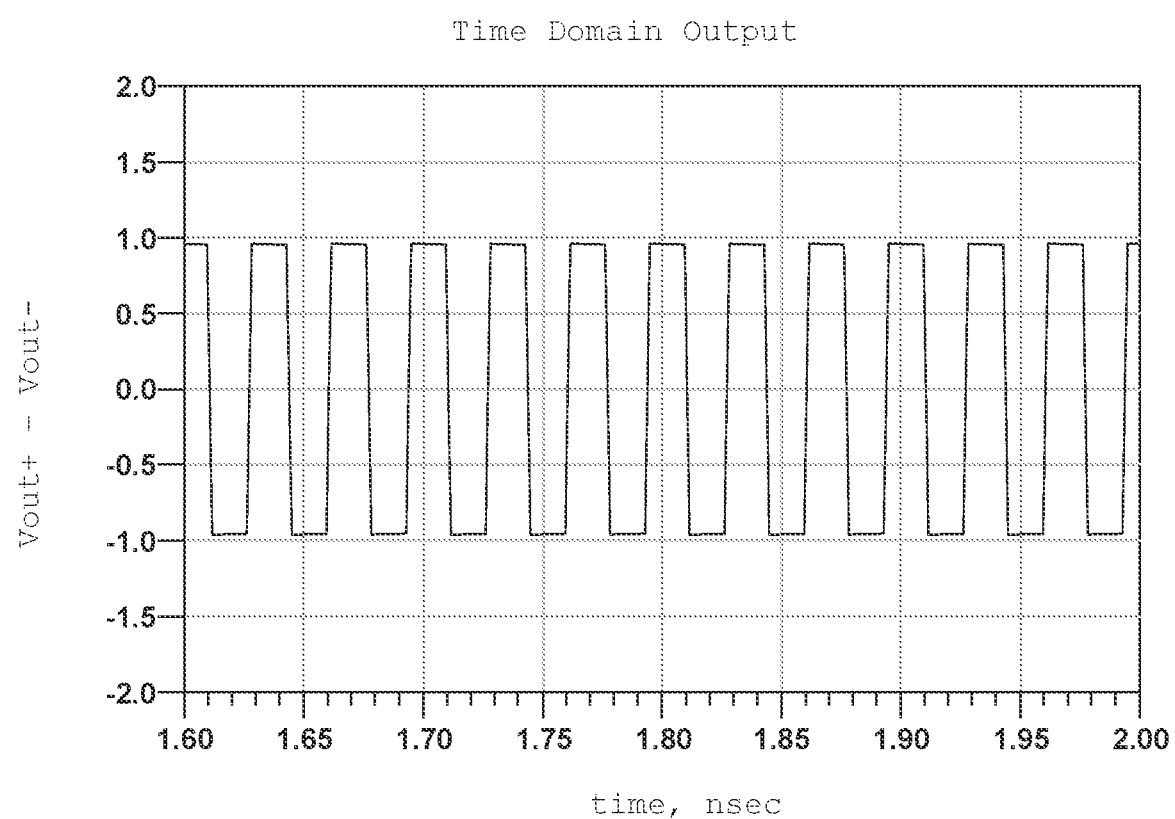
Figure 3C:
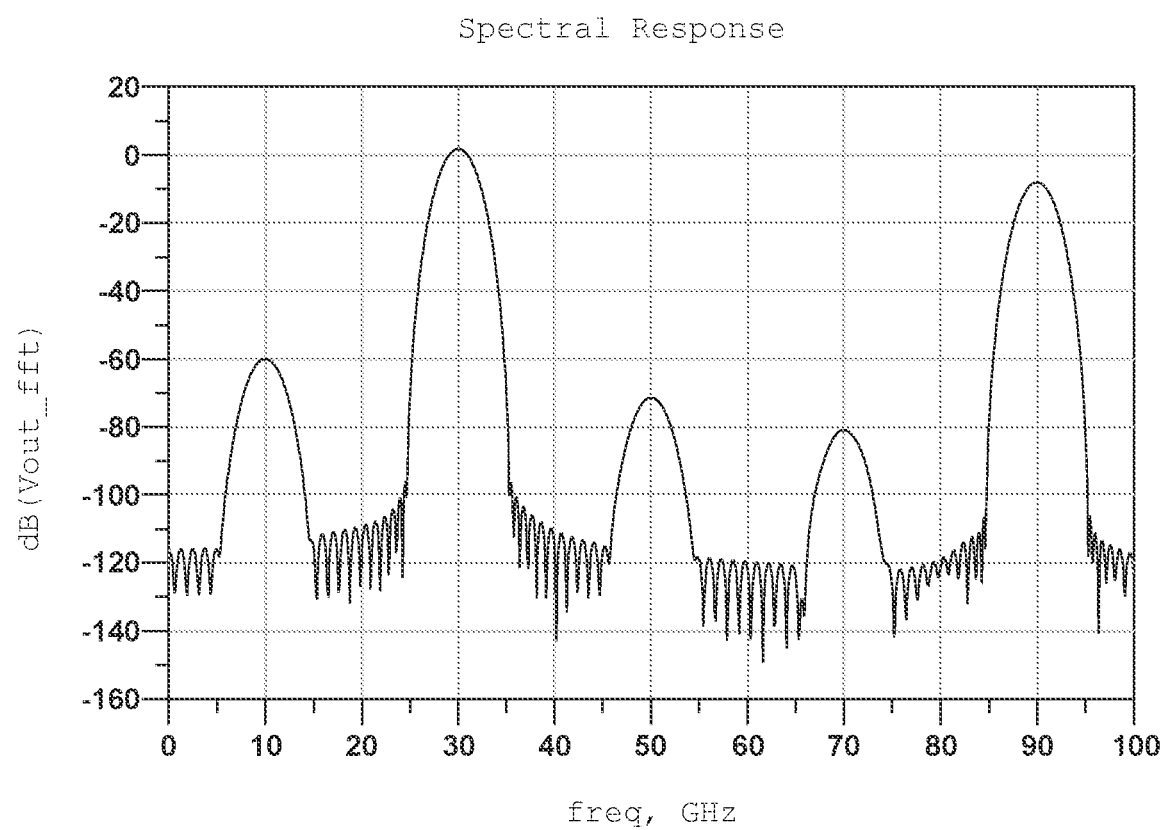

FIGS. 3A-3C illustrate a mixer core configured as an x3 SHM 300. As shown in FIG. 3A, only three of the differential mixers of the mixer core of the HRM topology of FIG. 1A are used. No weighting is deployed, the resistors of the HRM 100 are bypassed. The second differential mixer 304 of the three differential mixers may be inverted and the first and second clock inputs of the differential mixers may be programmed as shown, with the first differential mixer 302 receiving 0 and 180 degree phases, respectively, the second differential mixer 304 receiving 240 and 60 degree phases, respectively, and the third differential mixer 306 receiving 120 and 300 degree phases, respectively. The clock signals distributed to the first and second clock inputs of the first differential mixer 302, the second differential mixer 304 and the third differential mixer 306, respectively, are 180 degrees out of phase from one another.

FIG. 3B illustrates an example time domain output of a DC model of the x3 SHM 300 of FIG. 3A, in which the input to the differential mixer is DC and the frequency of the LO input to the differential mixer is 10 GHz to aid in illustration of the response of the differential mixer to generate a 30 GHz LO. Along the y-axis the DC output of the x3 SHM 300 is shown expressed as the positive voltage output (Vout+) minus the negative voltage output (Vout−). FIG. 3C illustrate a spectral response of the DC model of the x3 SHM 300 of FIG. 2A in the form of a fast Fourier transform of the output voltage shown in FIG. 3B. Along the y-axis the amplitude in decibel (dB) of the output signal is shown.

Example of a x4 SHM

Figure 4A:
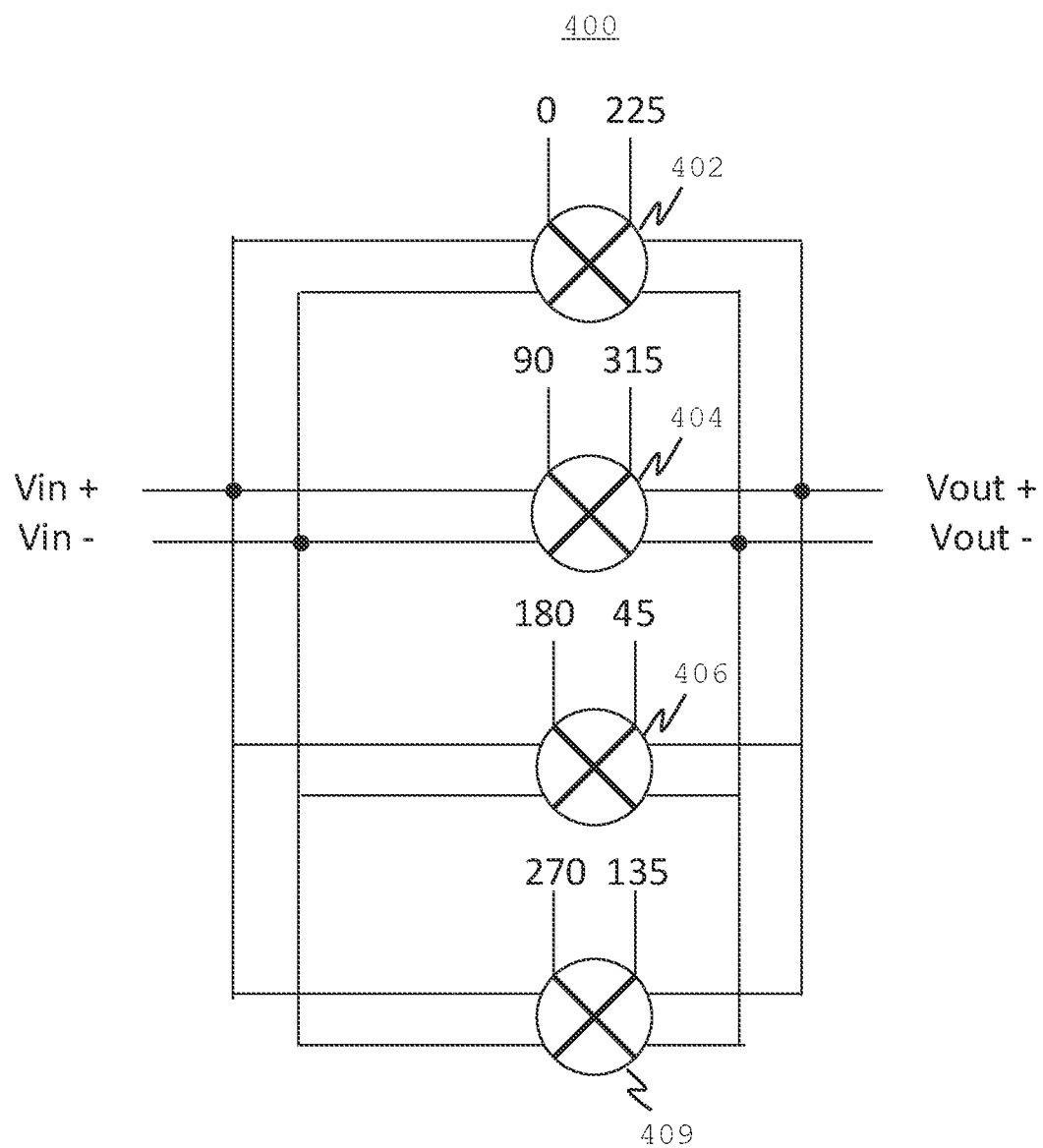
FIGS. 4A-4C illustrate a configuration of a x4 SHM mixer core in accordance with embodiments described herein.
Figure 4B:
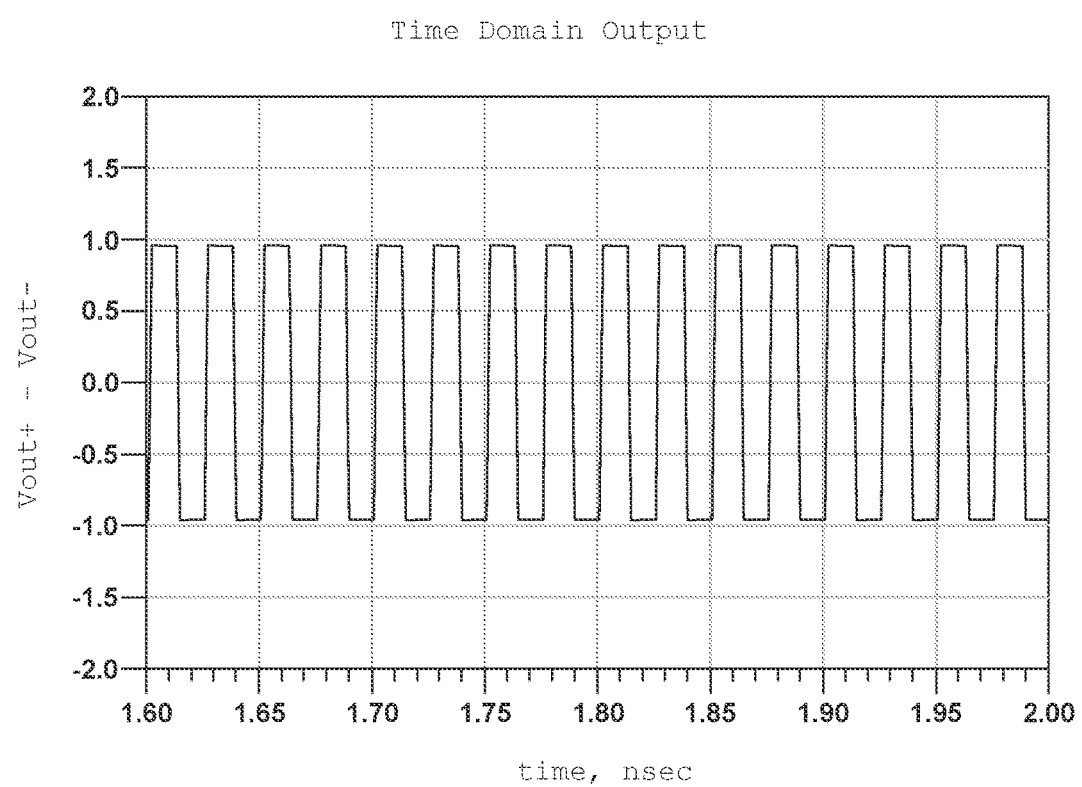
Figure 4C:
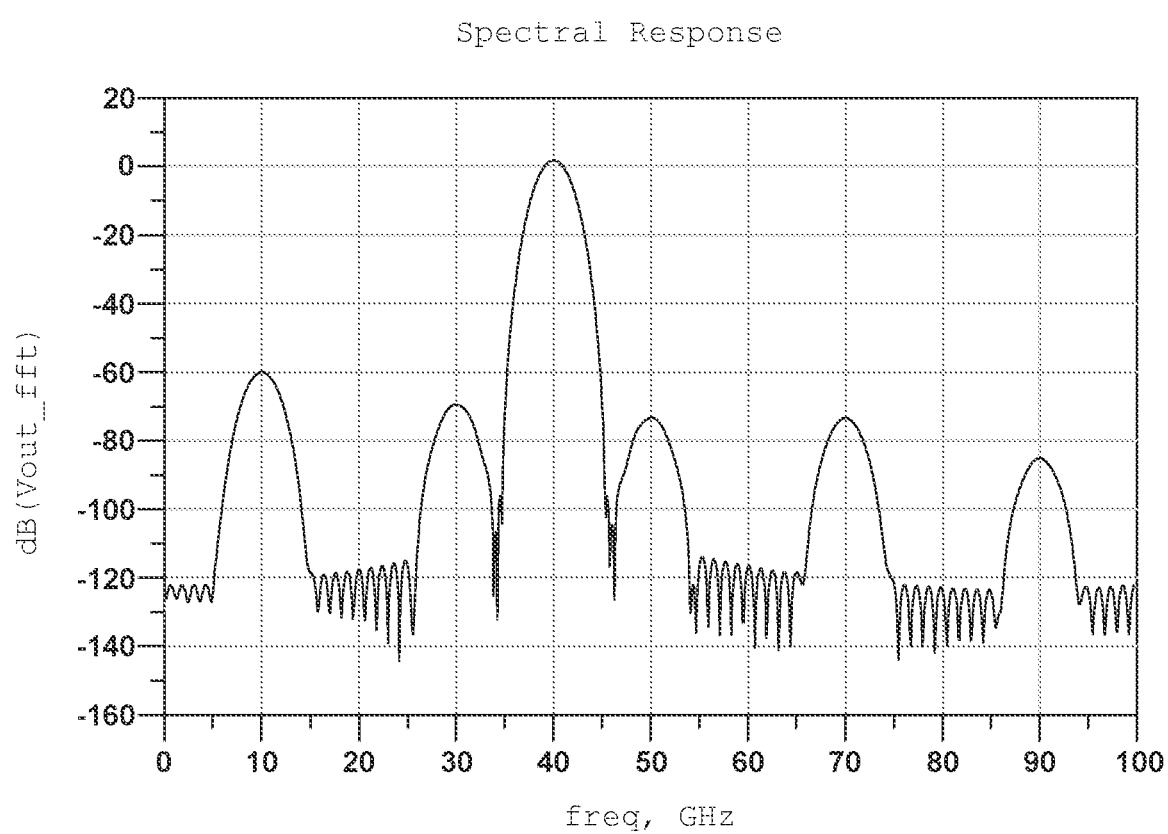

FIGS. 4A-4C illustrate a mixer core configured as an x4 SHM 400. As shown in FIG. 4A, all four of the differential mixers of the mixer core of the HRM topology of FIG. 1A are used. No weighting is deployed, the resistors of the HRM 100 are bypassed. The first and second clock inputs of the differential mixers may be programmed as shown, with the first differential mixer 402 receiving 0 and 225 degree phases, respectively, the second differential mixer 404 receiving 90 and 315 degree phases, respectively, the third differential mixer 406 receiving 180 and 45 degree phases, respectively, and the fourth differential mixer 408 receiving g 270 and 135 degree phases, respectively. The clock signals distributed to the first and second clock inputs of the first differential mixer 402, the second differential mixer 404, the third differential mixer 406 and the fourth differential mixer 408, respectively, are 225 degrees out of phase from one another.

FIG. 4B illustrates an example time domain output of a DC model of the x4 SHM 400 of FIG. 4A, in which the input to the differential mixer is DC and the frequency of the input LO is 10 GHz to aid in illustration of the response of the differential mixer to generate a 40 GHz LO. Along the y-axis the DC output of the x3 SHM 300 is shown expressed as the positive voltage output (Vout+) minus the negative voltage output (Vout−). FIG. 4C illustrate a spectral response of the DC model of the x4 SHM 400 of FIG. 4A in the form of a fast Fourier transform of the output voltage shown in FIG. 4B. Along the y-axis the amplitude in decibel (dB) of the output signal is shown. The fundamental spur along with odd harmonics of the fundamental may also be created.

Example System with HRM or SHM Topology

Figure 5:
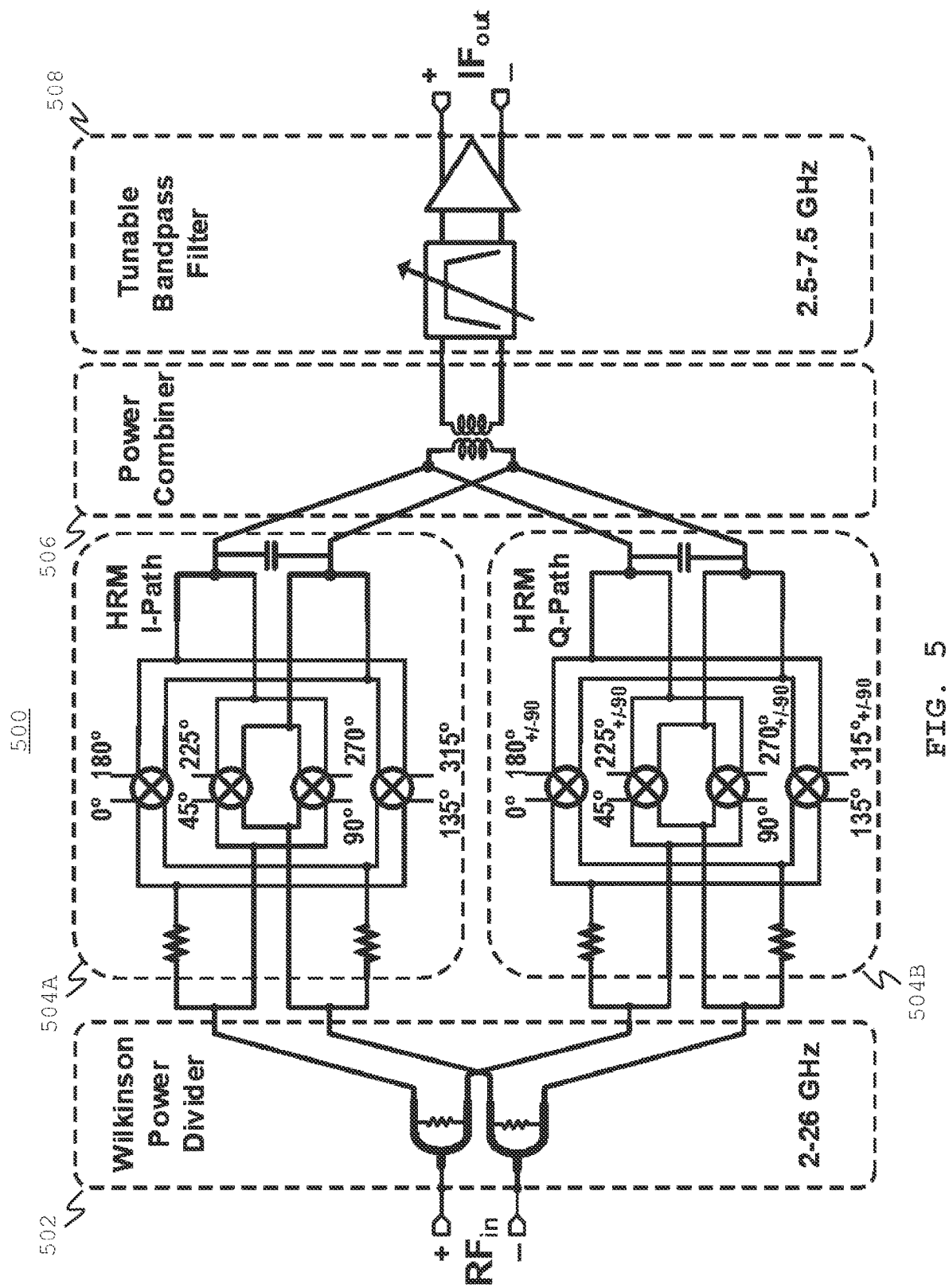
FIG. 5 is a schematic block diagram of an example system in which a HRM or SHM topology may be implemented in accordance with embodiments described herein.

FIG. 5 shows an example system 500 in which an HRM or SHM topology may be implemented. The system 500 represents a part of an example RF front end. The system 500 may include direct conversion transmitters that may include in-phase (I) and quadrature phase (Q) baseband paths, each including a respective mixer core 504A, 504B. As shown in FIG. 5, the system 500 may include a power divider 502, in this example a Wilkinson power divider, an HRM/SHM mixer core 504A in the I-path, an HRM/SHM mixer core 504B in the Q-path, a power combiner 506, and a tunable bandpass filter 508.

In the embodiment illustrated in FIG. 5, the mixer cores 504A, 504B are configured as an HRM, similar to the HRM 100 of FIG. 1A.

In another embodiment (not shown), the mixer cores 504A, 504B may be configured as an x2 SHM, e.g., similar to the x2 SHM 200 of FIG. 2A. The x2 SHM mixer cores may utilize the inside two differential mixers of the mixer cores 504A, 504B and only four clock phases (0, 90, 180, and 270) per cycle may be used. The outside two differential mixers may be turned off. The x2 SHM implementation provides an option for up to 40 GHz operation and band overlap provides frequency planning options.

In another embodiment (not shown), the mixer cores 504A, 504B may be configured as an x3 SHM, e.g., similar to the x3 SHM 300 of FIG. 3A. In the x3 SHM mixer cores the resistors of the mixer cores 504A, 504B may be shorted out, one of the differential mixers may be turned off, six clock phases (0, 60, 120, 180, 240, and 300) per cycle may be used and the second differential mixer may be inverted from the first and third differential mixers. The x3 SHM implementation provides an option for up to 50 GHz operation and significant band overlap provides frequency planning options.

In another embodiment (not shown), the mixer cores 504A, 504B may be configured as an x4 SHM, e.g., similar to the x4 SHM 400 of FIG. 4A. In the x4 SHM mixer cores the resistors of the mixer cores 504A, 504B may be shorted out and the eight clock phases may be reordered. The x4 SHM implementation provides an option for greater than 30 GHz operation.

Example of a Reconfigurable HRM/SHM Mixer

An aspect of the present disclosure provides a configurable HRM/SHM topology that enables a single mixer core to be configured to operate as one or more of an HRM, such as the HRM 100 of FIG. 1A, a x2 SHM, such as the x2 SHM 200 of FIG. 2A, a x3 SHM, such as the x3 SHM 300 of FIG. 3A and a x4 SHM, such as the x4 SHM 400 of FIG. 4A.

Figure 6A:
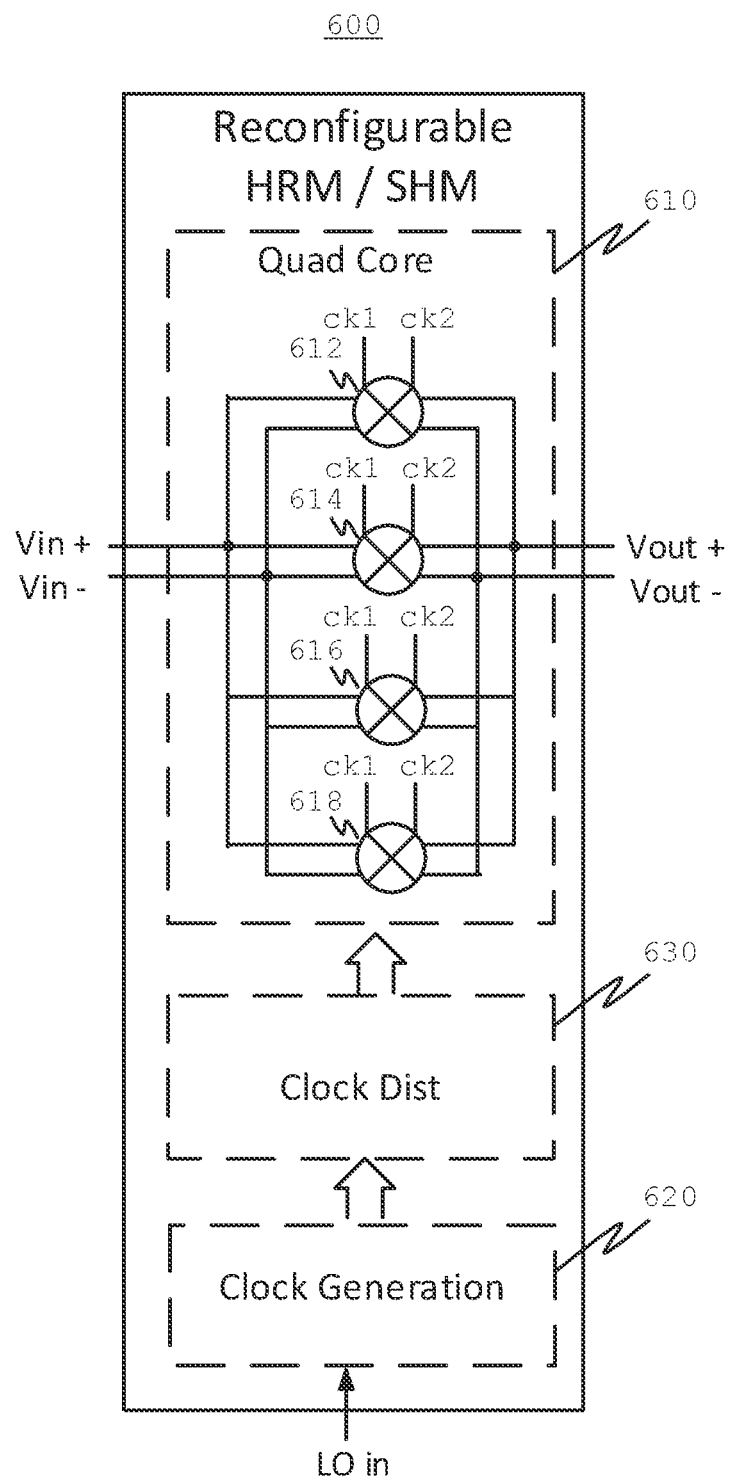
FIGS. 6A-6B illustrate a block diagram of a reconfigurable HRM/SRM mixer in accordance with embodiments described herein.

FIG. 6A illustrates a block diagram of a reconfigurable HRM/SHM mixer 600 in accordance with embodiments described herein. The reconfigurable HRM/SHM mixer 600 may include a mixer core 610 that may be reconfigured to operate as an HRM, a x2 SHM, a x3 SHM or a x4 SHM mode. The reconfigurable HRM/SHM mixer 600 may be configurable to operate in two, three or four of these modes.

The reconfigurable HRM/SHM mixer 600 may be used to implement the mixer cores 504A, 504B as HRM, x2 SHM, x3 SHM or x4 SHM in the example of FIG. 5 or in any other RF front end system utilizing HRM and/or SHM mixers.

As shown in FIG. 6A, the reconfigurable HRM/SHM mixer 600 may include a mixer core 610 including four differential mixers 612-618, a clock generation circuit 620 for generating various clock phases from an input LO signal, and a clock distribution circuit 630 for distributing the various clock phases to the first and second clock inputs (CK1, CK2) of the differential mixers 612-618 as required by the configuration/implementation.

Figure 6B:
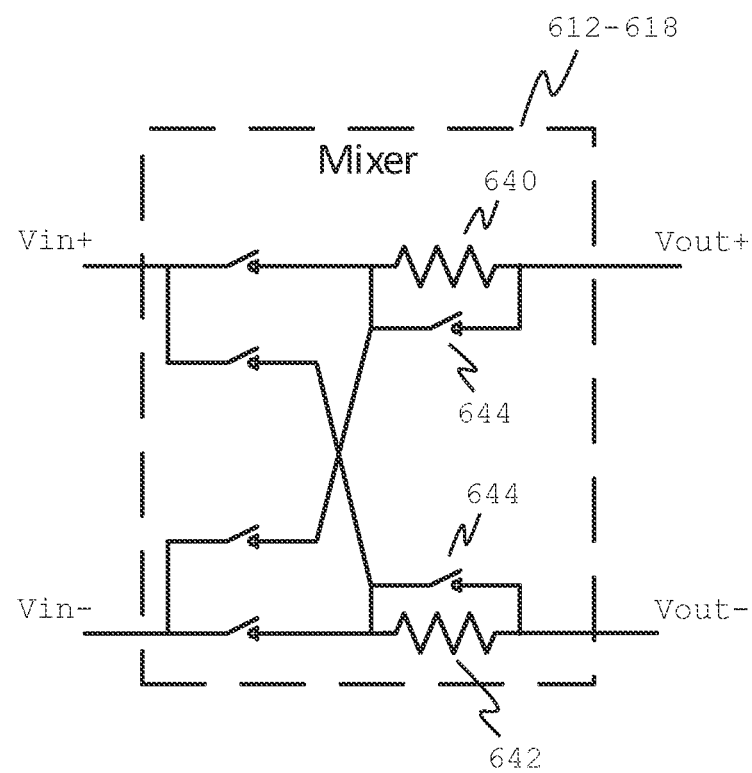

Each differential mixer 612-618 may be implemented as shown in FIG. 6B and may include internal resistors 640, 642. Resistors 640, 642 may be bypassed using a switch 644 as necessary for the configuration/implementation. For example, in HRM mode two of the differential mixers 612-618 may be configured to include a resistor in the signal path and in SHM mode resistors may be bypassed to exclude the resistor from the signal path.

Different mixer states may be configured by opening or closing switches in the differential mixers 612-618. The different mixer states, together with the required clock distribution for the different modes of operation, enable the reconfigurable HRM/SHM mixer 600 to operate in one of the HRM, x2 SHM, x3 SHM and x4 SHM modes.

Figure 7B:
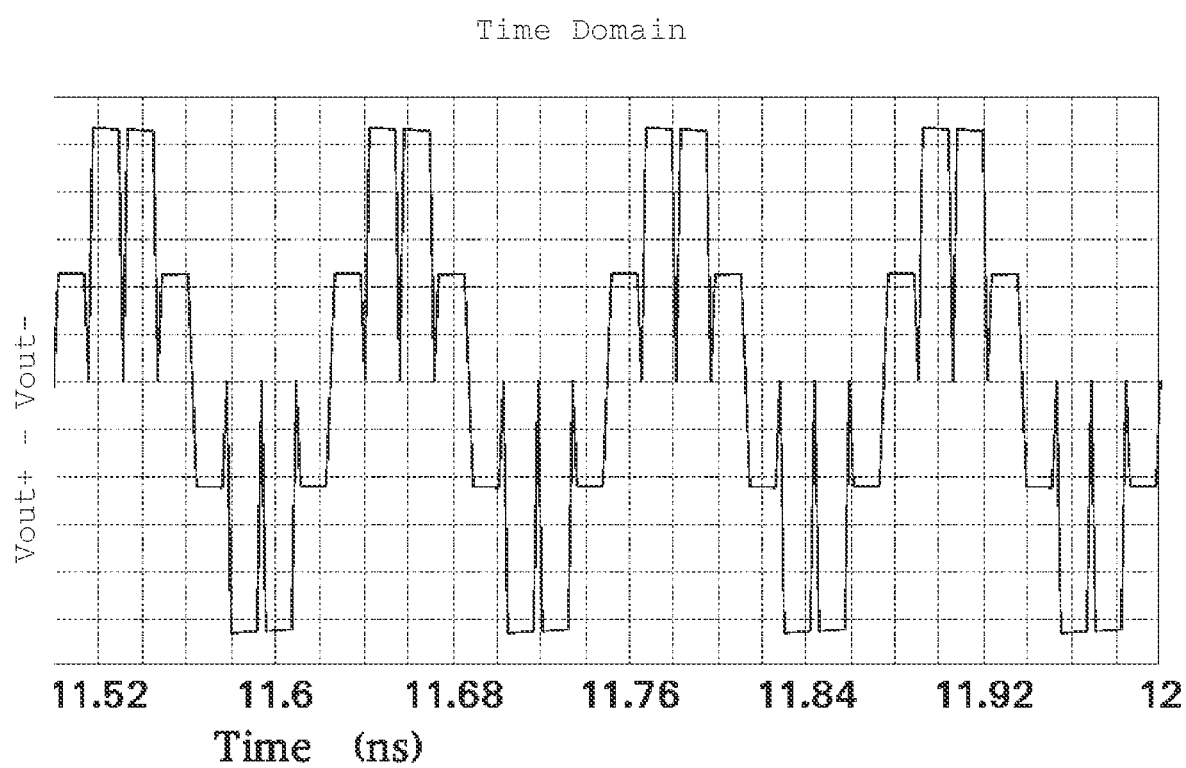
Figure 7C:
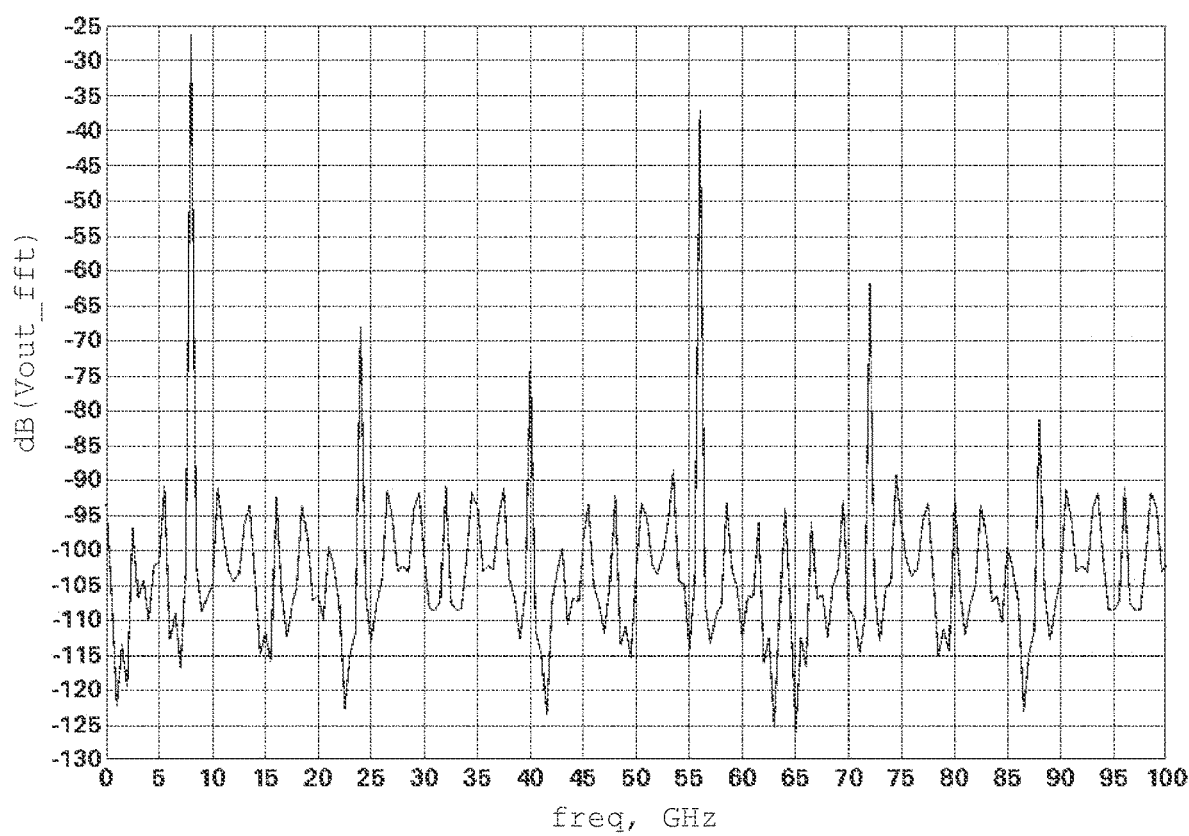

FIGS. 7A-7C illustrate operation of a reconfigurable HRM/SRM topology, such as the reconfigurable HRM/SHM mixer 600 of FIG. 6A, in accordance with embodiments described herein for implementing an HRM that operates as the HRM 100 of FIG. 1A. In particular, FIG. 7A illustrates eight mixer states 700 per cycle as may be set in a differential mixer, such as differential mixer 612-618 shown in FIG. 6B. Cycles may be repeated to generate multiple signal cycles as shown in FIGS. 7B and 7C.

In FIG. 7A for each of the states 1-8 the internal configuration (depicted MixerState) of a differential mixer is shown. In states 1, 4, 5 and 8 the internal resistors 640, 642 may be included in the signal path by opening the switches 644. In states 2, 3, 6 and 7 the internal resistors 640, 642 may be excluded from the signal path by closing the switches 644 thereby bypassing the resistors 640, 642. The left four switches of the differential mixer may be controlled by the clock signals ck1, ck2 received from the clock distribution circuit 630. An input signal from a differential source (depicted Dif.Src) may be input to the differential mixer. The upper signal path from the differential source may include Vin+ and the lower signal path from the differential source may include Vin−, such as shown in FIG. 6B. Output from the differential mixer may be connected to a differential load (depicted Diff.Ld), such that the upper input to the differential load may include Vout+ and the lower input to the differential load may include Vout−, such as shown in FIG. 6B.

FIGS. 7B and 7C are plots of simulation results for a DC model of the HRM configured using the mixer states 700 and using ideal switches, an LO of 8 GHz, and non-overlapping clocks. The result is an 8 GHz output LO with reduced 3rd and 5th harmonics. FIG. 7B shows the time domain output and FIG. 7C shows the frequency domain output.

Figure 8B:
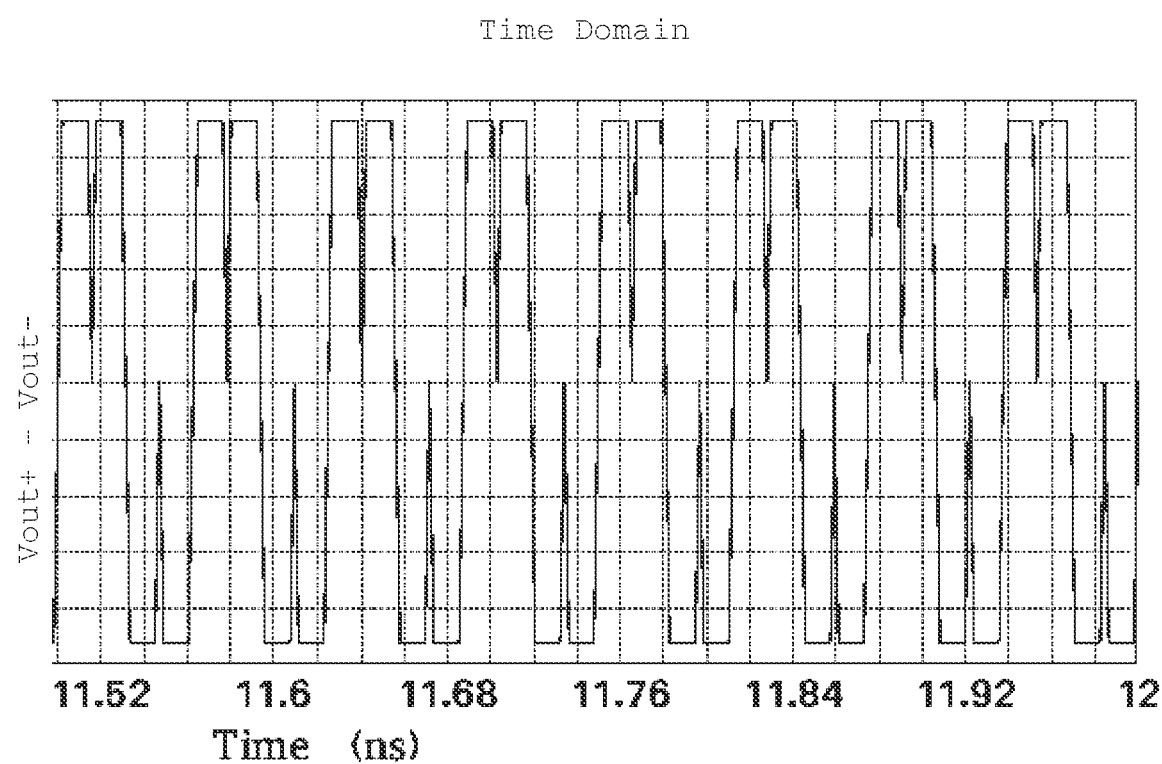
Figure 8C:
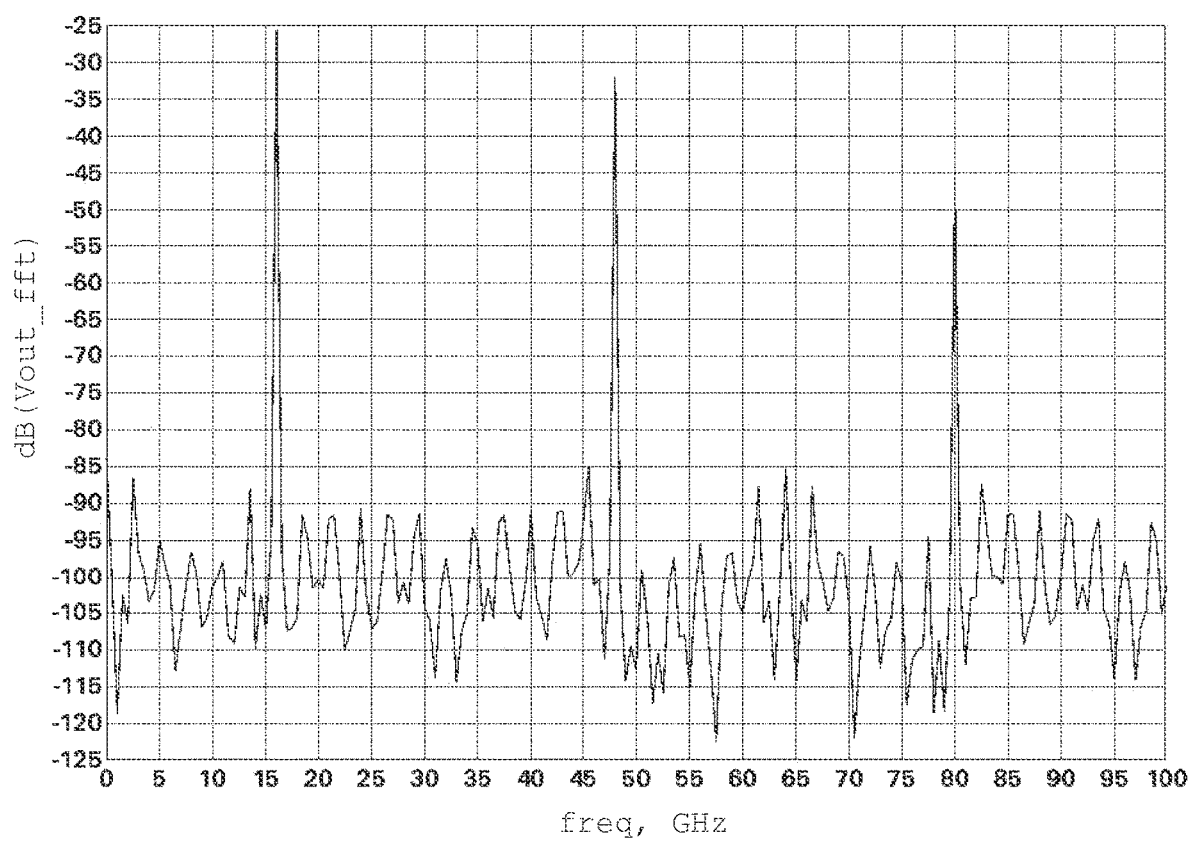

FIGS. 8A-8C illustrate operation of a reconfigurable HRM/SRM topology, such as the reconfigurable HRM/SHM mixer 600 of FIG. 6A, in accordance with embodiments described herein for implementing an x2 SHM, such as the x2 SHM 200 of FIG. 2A. In particular, FIG. 8A illustrates eight mixer states 800 per cycle as may be set in a differential mixer, such as differential mixer 612-618 shown in FIG. 6B. Cycles may be repeated to generate multiple signal cycles as shown in FIGS. 8B and 8C.

In FIG. 8A for each of the states 1-8 the internal configuration (depicted MixerState) of a differential mixer is shown. In all states 1-8 the internal resistors 640, 642 may be excluded from the signal path by closing the switches 644 thereby bypassing the resistors 640, 642. The left four switches of the differential mixer may be controlled by the clock signals ck1, ck2 received from the clock distribution circuit 630. An input signal from a differential source (depicted Dif.Src) may be input to the differential mixer. The upper signal path from the differential source may include Vin+ and the lower signal path from the differential source may include Vin−, such as shown in FIG. 6B. Output from the differential mixer may be connected to a differential load (depicted Diff.Ld), such that the upper input to the differential load may include Vout+ and the lower input to the differential load may include Vout−, such as shown in FIG. 6B.

FIGS. 8B and 8C are plots of simulation results for a DC model of the x2 SHM configured using the mixer states 800 and using ideal switches, an LO of 8 GHz, and non-overlapping clocks. The result is an effective 16 GHz output LO. FIG. 8B shows the time domain output and FIG. 8C shows the frequency domain output.

Figure 9B:
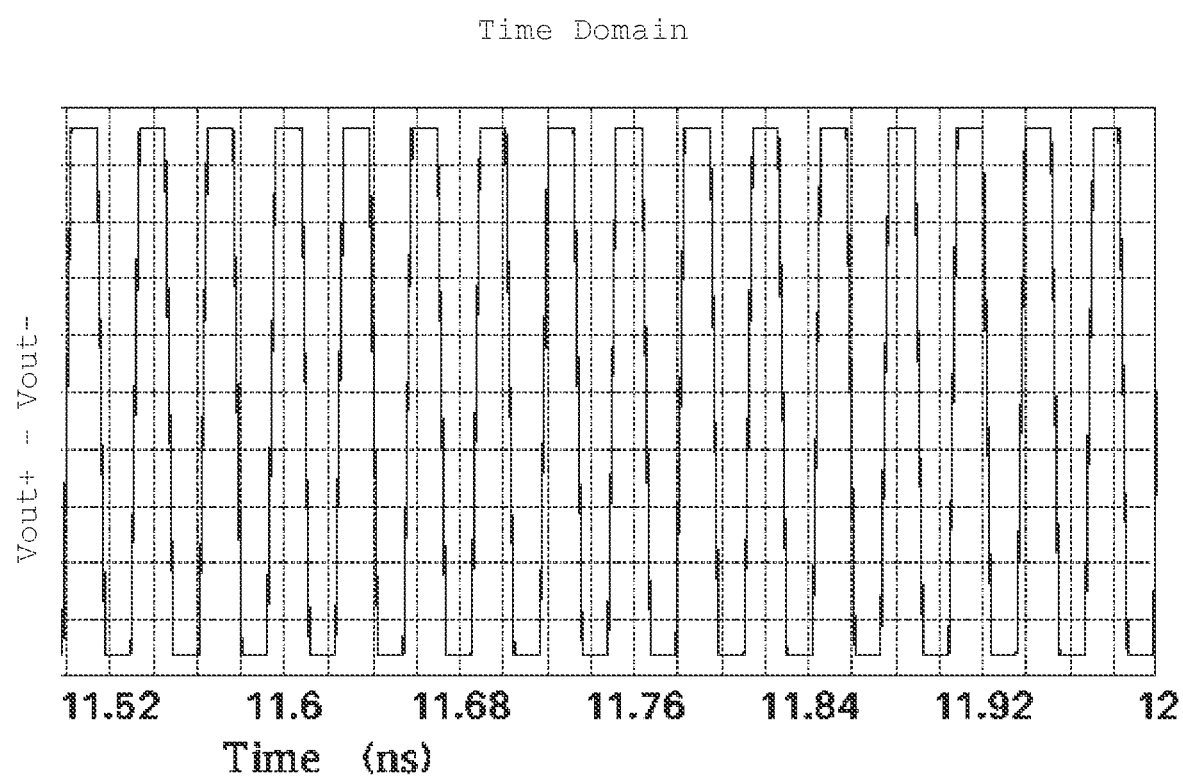
Figure 9C:
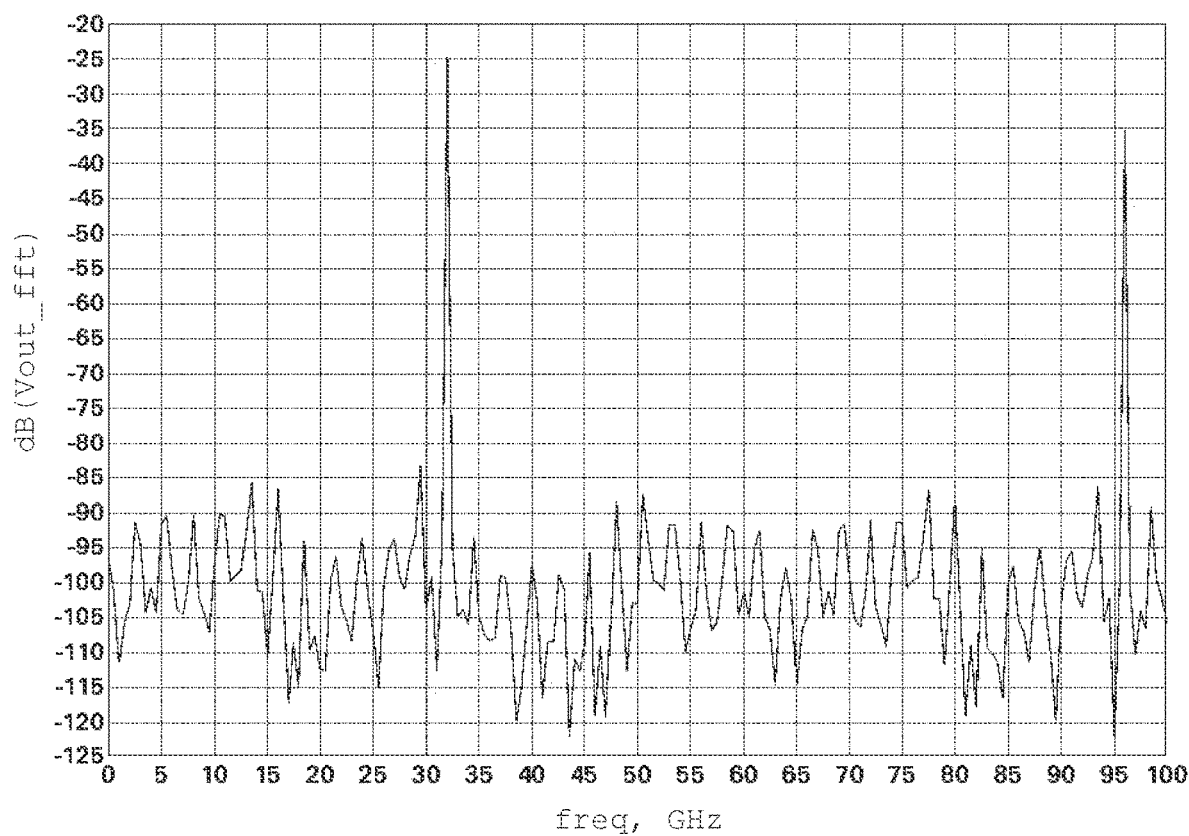

FIGS. 9A-9C illustrate operation of a reconfigurable HRM/SRM topology, such as the reconfigurable HRM/SHM mixer 600 of FIG. 6A, in accordance with embodiments described herein for implementing an x4 SHM, such as the x4 SHM 400 of FIG. 4A. In particular, FIG. 9A illustrates eight mixer states 900 per cycle as may be set in a differential mixer, such as differential mixer 612-618 shown in FIG. 6B. Cycles may be repeated to generate multiple signal cycles as shown in FIGS. 9B and 9C.

In FIG. 9A for each of the states 1-8 the internal configuration (depicted MixerState) of a differential mixer is shown. In all states 1-8 the internal resistors 640, 642 may be excluded from the signal path by closing the switches 644 thereby bypassing the resistors 640, 642. The left four switches of the differential mixer may be controlled by the clock signals ck1, ck2 received from the clock distribution circuit 630. An input signal from a differential source (depicted Dif.Src) may be input to the differential mixer. The upper signal path from the differential source may include Vin+ and the lower signal path from the differential source may include Vin−, such as shown in FIG. 6B. Output from the differential mixer may be connected to a differential load (depicted Diff.Ld), such that the upper input to the differential load may include Vout+ and the lower input to the differential load may include Vout−, such as shown in FIG. 6B.

FIGS. 9B and 9C are plots of simulation results for a DC model of the x4 SHM configured using the mixer states 900 and using ideal switches, an LO of 8 GHz, and non-overlapping clocks. The result is an effective 32 GHz output LO. FIG. 9B shows the time domain output and FIG. 9C shows the frequency domain output.

Implementation Variations for Implementing a Reconfigurable HRM/SRM Topology

Figure 10:
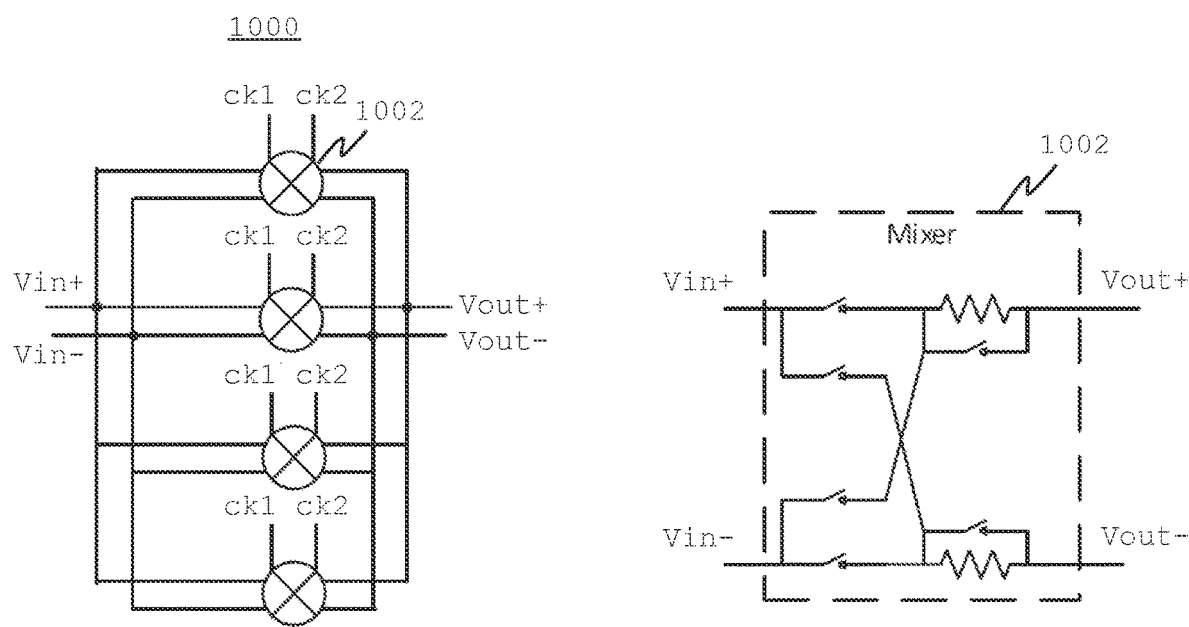
FIGS. 10-12 illustrate examples of passive mixer implementation variations in accordance with embodiments described herein.
Figure 11:
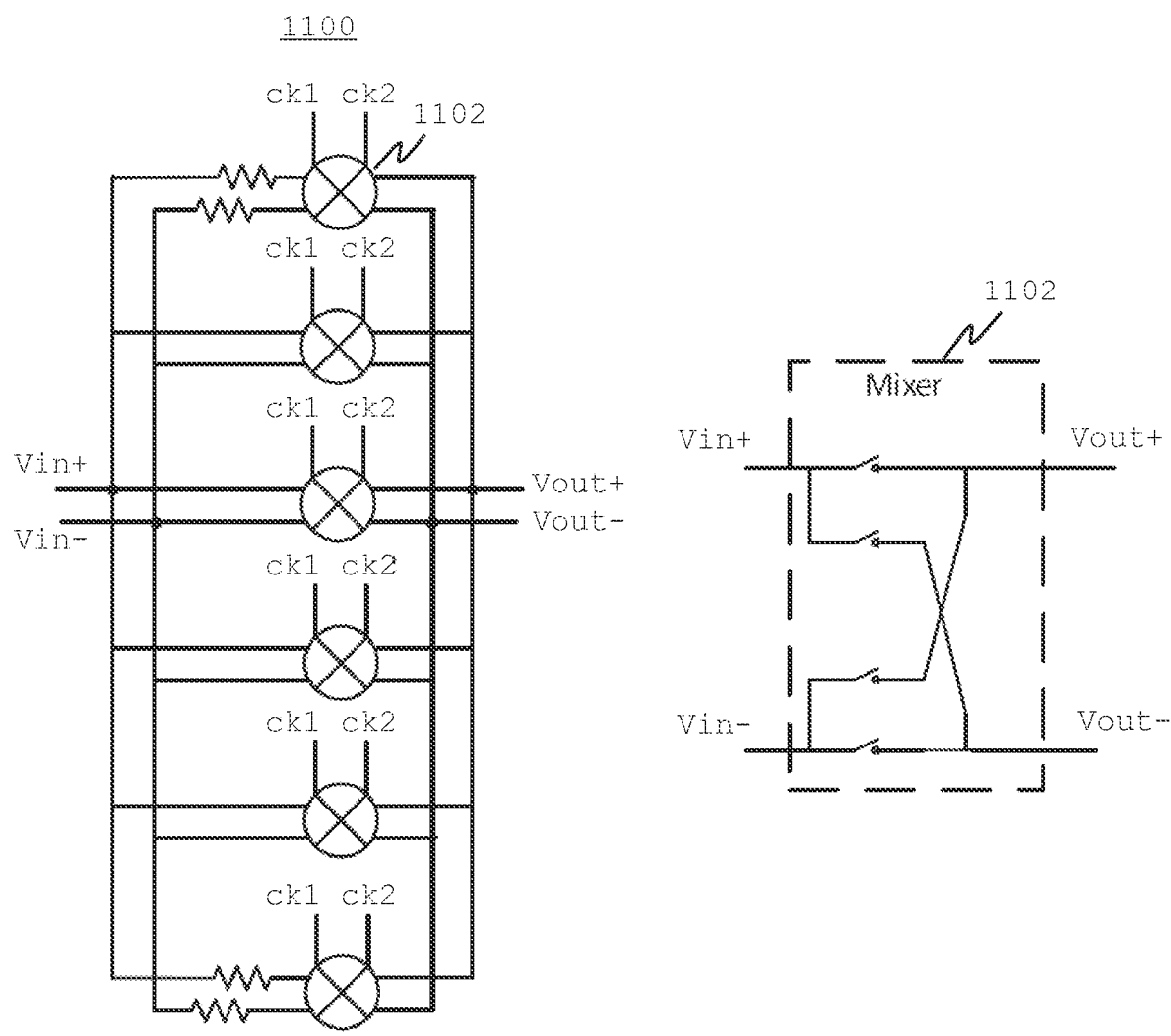
Figure 12:
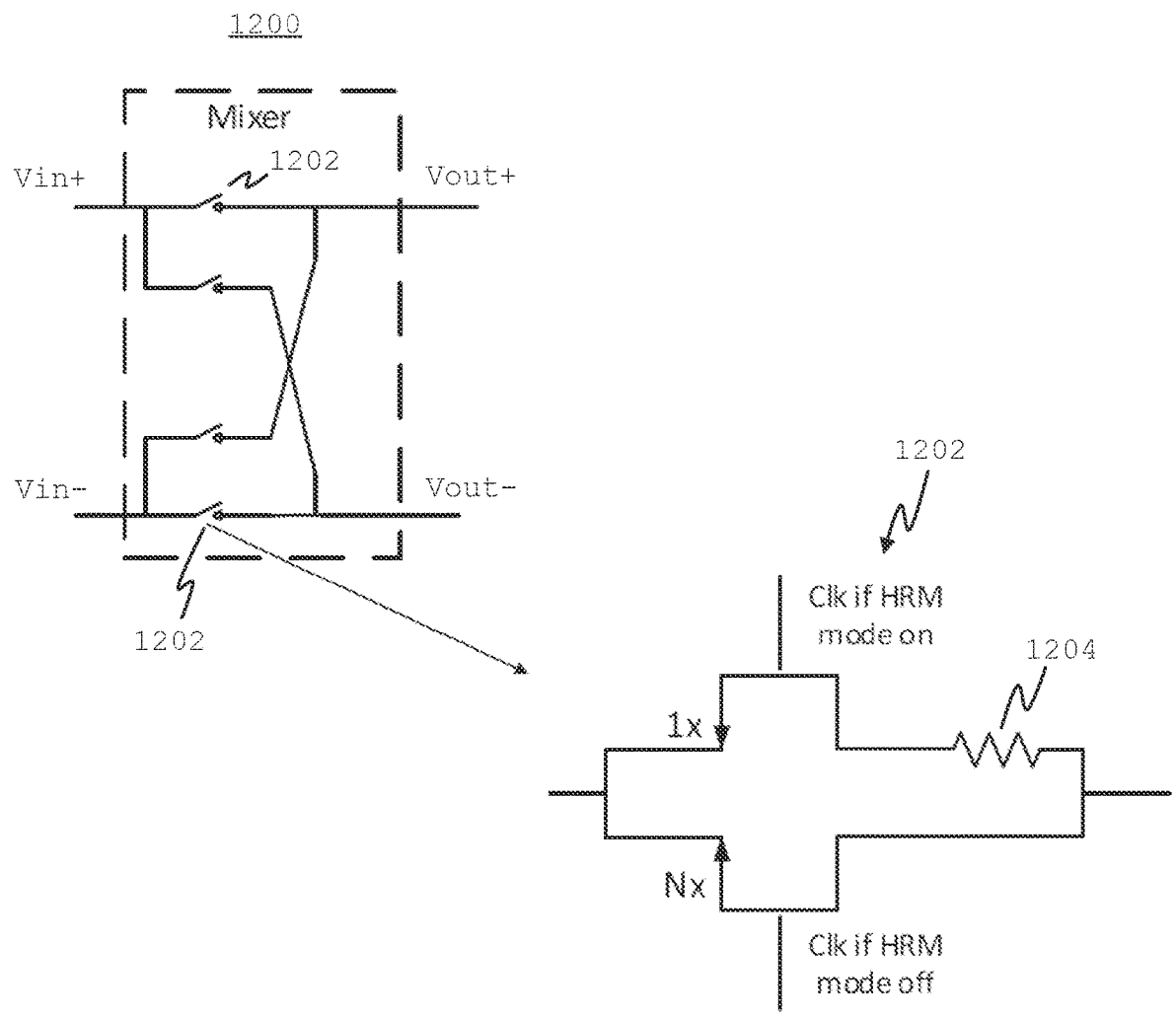
Figure 13:
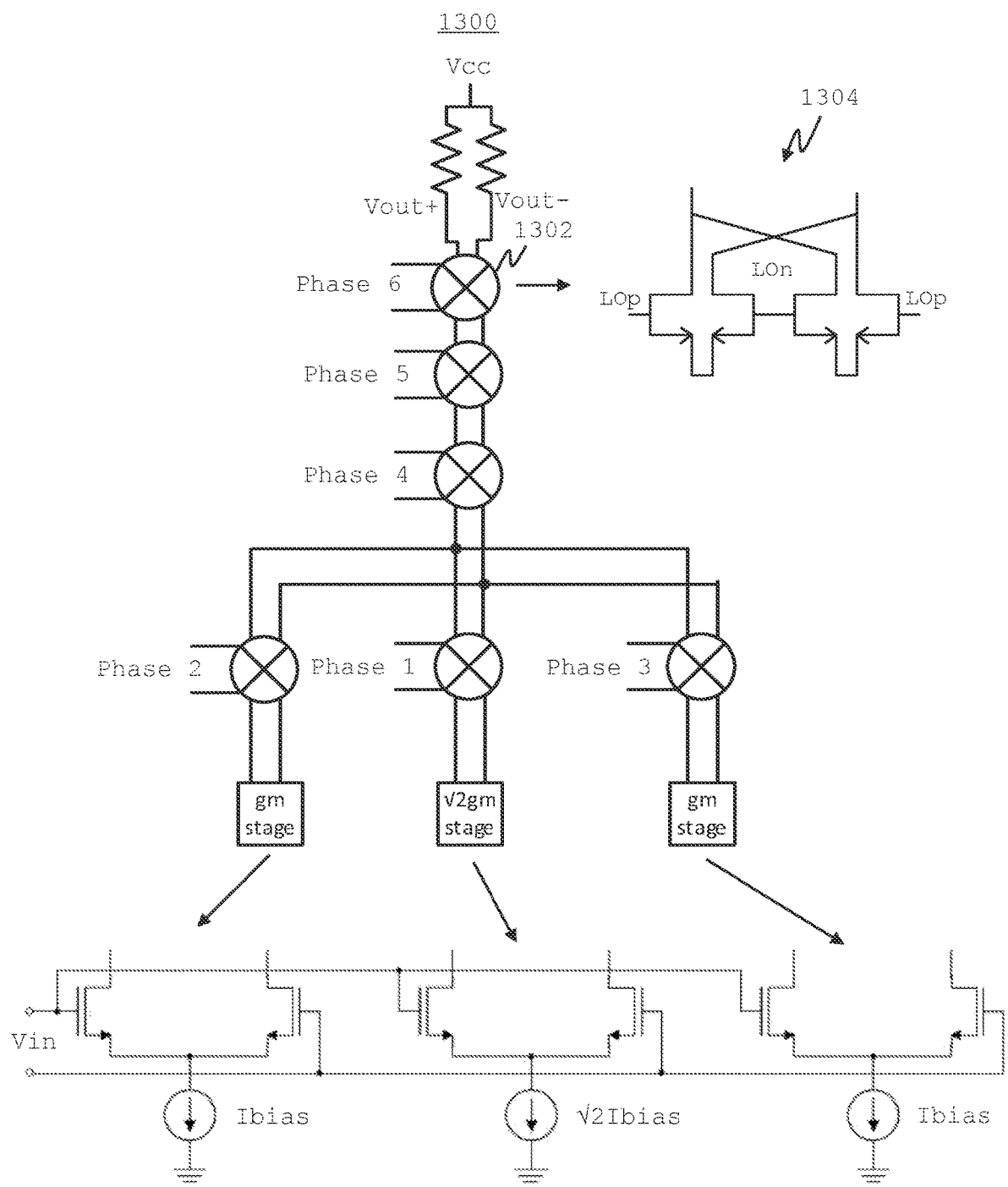
FIGS. 13-14 illustrate examples of active mixer implementation variations in accordance with embodiments described herein.
Figure 14:
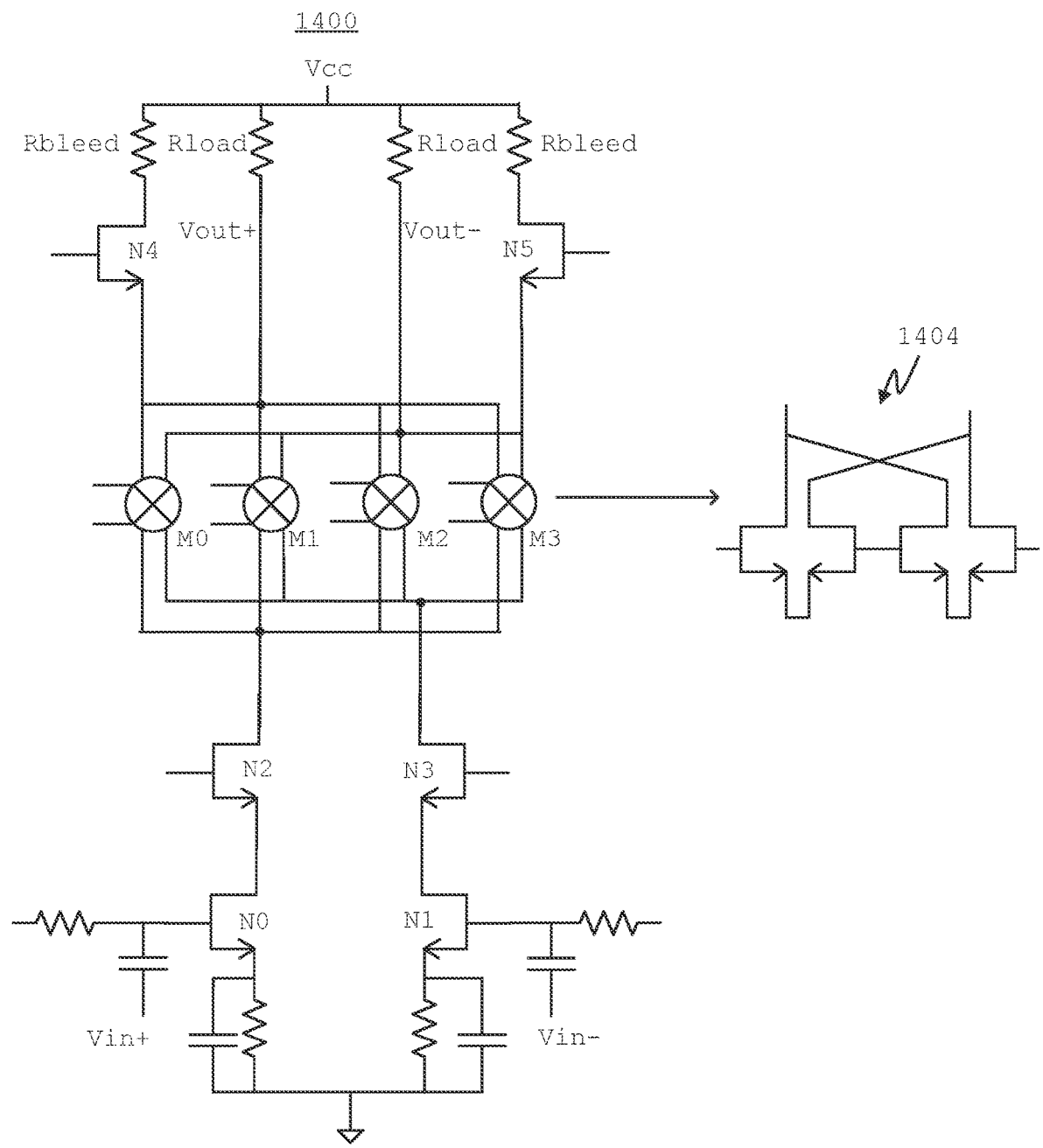

FIGS. 10-14 illustrate a non-limiting variety of implementation variations of mixer cores for use in implementing a reconfigurable HRM/SRM topology. FIGS. 10-12 illustrate examples of passive differential mixers. Passive mixers typically use a diode element or a field-effect transistors (FET) operated as a switch. FIGS. 13 and 14 illustrate examples of active differential mixers. Active mixers typically use transistor-based circuits to achieve frequency conversion.

FIG. 10 illustrates an example embodiment of a first mixer core 1000 including four differential mixers 1002 in which a resistor bypass is implemented internal to each of the differential mixers, similar to the example differential mixer 612-618 of FIG. 6B. In the differential mixer 1002 a resistor may be bypassed by a bypass switch along the resistor. When the bypass switch is in an open state, the signal path from Vin to Vout includes the resistor. When the bypass switch is in a closed state, the signal path from Vin to Vout includes the switch thereby bypassing the resistor. A clock distributor, such as the clock distribution circuit 630 of FIG. 6A, may distribute the plurality of clock signals to the first and second clock inputs of the differential mixers 1002 in accordance with the designated operation of the reconfigurable mixer as an HRM or an SHM.

FIG. 11 illustrates an example embodiment of a second mixer core 1100 including six differential mixers 1102, each of which includes a single switch, and in which a resistor path (associated with the first and sixth differential mixers) is only used in HRM mode. Differential mixers may be enabled or disabled by operating the switched in the differential mixers 1102. In HRM mode the first and sixth of the differential mixers 1102 may close switches to thereby include the resistor paths and two other of the differential mixers 1102 may be bypassed by opening all switches. The resulting HRM may operate similar to the HRM 100 of FIG. 1A. In the x2 SHM mode the first and sixth of the differential mixers 1102 may open all switches to thereby exclude the resistor paths and two other of the differential mixers 1102 may be bypassed by opening all switches. In the x3 SHM mode the first and sixth of the differential mixers 1102 may open all switches to thereby exclude the resistor paths and one other of the differential mixers 1102 may be bypassed by opening all switches. In the x4 SHM mode the first and sixth of the differential mixers 1102 may open all switches to thereby exclude the resistor paths. A clock distributor, such as the clock distribution circuit 630 of FIG. 6A, may distribute the plurality of clock signals to the first and second clock inputs of the enabled differential mixers 1102 in accordance with the designated operation of the reconfigurable mixer as an HRM or an SHM.

FIG. 12 illustrates an example embodiment of an alternative differential mixer 1200, which may be used as an alternative to the differential mixer 1002 of FIG. 10 or the differential mixer 1102 of FIG. 11. In the alternative differential mixer 1200 a switch 1202 may be implemented having two modes of operation, configurable by an input clock signal. In a first mode of operation a transistor 1×may be activated by a clock signal depicted 'Clk if HRM mode on', thereby enabling the switch to include resistor 1204. In a second mode of operation a transistor Nx may be activated by a clock signal depicted 'Clk if HRM mode off', thereby enabling the switch without resistor 1204. The same switch may be used to implement either an HRM path or an SHM path by providing the clock signal to the path including the resistor or to the path without the resistor. The first mode of operation may be used to configure the reconfigurable HRM/SRM topology to function as an HRM. The second mode of operation may be used to configure the reconfigurable HRM/SRM topology to function as a x2 SHM, x3 SHM or x4 SHM. The transistors may be implemented as FETs.

FIG. 13 illustrates an example embodiment of an active mixer topology 1300 including six differential mixers 1302. Three differential mixers are placed in parallel and receive clock phases 1, 2 and 3, respectively. Three other differential mixers are placed in series and receive clock phases 4, 5 and 5, respectively. The differential mixers 1302 may be active mixers and each differential mixer 1302 may be implemented as a Gilbert cell 1304. A Gilbert cell is a type of mixer, which produces output signals that are proportional to the product of two input signals. An advantage of an active mixer topology is that signals may be buffered, resulting in fewer spurs injected back on input. Also, gain may be better than in passive mixer topologies.

An example topology of a Gilbert cell 1304 is shown to the right in FIG. 13, wherein LO positive (depicted LOp) and LO negative (depicted LOn) signal paths are shown. LOp and LOn may be controlled by the phase provided to the differential mixer 1302.

The active mixer topology 1300 may receive a signal input (depicted Vin; Vin may include a Vin− and a Vin+ component) via three forward transconductance stages (depicted gm stage and √2 gm stage). Internals of the three forward transconductance stages are further detailed at the bottom of FIG. 13, where the left and right transconductance stages may draw a bias current (depicted Ibias) and the middle transconductance stage may draw a bias current multiplied by a factor √2 (depicted √2Ibias). The output (depicted Vout+ and Vout−) of the active mixer topology 1300 may be connected to the top differential mixer in FIG. 13.

The active mixer topology 1300 may be configured to operate as HRM by applying the following phases to Phase 1-Phase 6 respectively: 0 degrees, −45 degrees, +45 degrees, DC, DC, DC. The active mixer topology 1300 may be configured to operate as x2 SHM by applying the following phases to Phase 1-Phase 6 respectively: 0 degrees, 0 degrees, 0 degrees, 90 degrees, DC, DC. The active mixer topology 1300 may be configured to operate as x4 SHM by applying the following phases to Phase 1-Phase 6 respectively: 0 degrees, 0 degrees, 0 degrees, 90 degrees, +45 degrees, −45 degrees. Herein, the degrees indicate how far the clock signals distributed to the first and second clock inputs of the differential mixer 1302 are out of phase from one another. DC may be a static case wherein LOp=1 and LOn=0.

FIG. 14 illustrates an example embodiment of an alternative active mixer topology 1400, wherein differential mixers M0-M3 may be active differential mixers 1402. The differential mixers M0-M3 may be implemented as a cascode (Gilbert cell) topology 1404, similar to the Gilbert cell 1304 of FIG. 13. Clock distribution to the differential mixers M0-M3 may be implemented similar to the clock distribution in the passive mixer topologies, e.g., as shown in FIG. 6A. A polyphase LO may create non-overlapping pulses at ⅛ duty to each active differential mixer 1402.

The alternative active mixer topology 1400 may receive a signal input (depicted Vin+ and Vin−) via transistors N0 and N1. Further transistors N2 and N3 may enable the input signal to be fed to the differential mixers M0-M3. The output of the alternative active mixer topology 1400 is depicted Vout+ and Vout−, in FIG. 14 shown to be connected to a load resistance Rload.

In the alternative active mixer topology 1400 the transistors N4 and N5 may provide a current bleed option via a bleed resistor (depicted Rbleed) for HRM mode. In HRM mode transistors N4 and N5 may be on when any clock in M0 or M3 are on, and transistors N4 and N5 may be off when any clock in M1 or M2 are on. In SHM modes transistors N4 and N5 may be off.

Example of a Clock Distributor

Clock signals having different phases may be distributed to the differential mixers by a clock distributor, such as the clock distribution circuit 630 of FIG. 6A. The clock distributor may distribute the plurality of clock signals to the first and second clock inputs of the differential mixers in accordance with a designated operation of the reconfigurable mixer as an HRM or an SHM.

Figure 15:
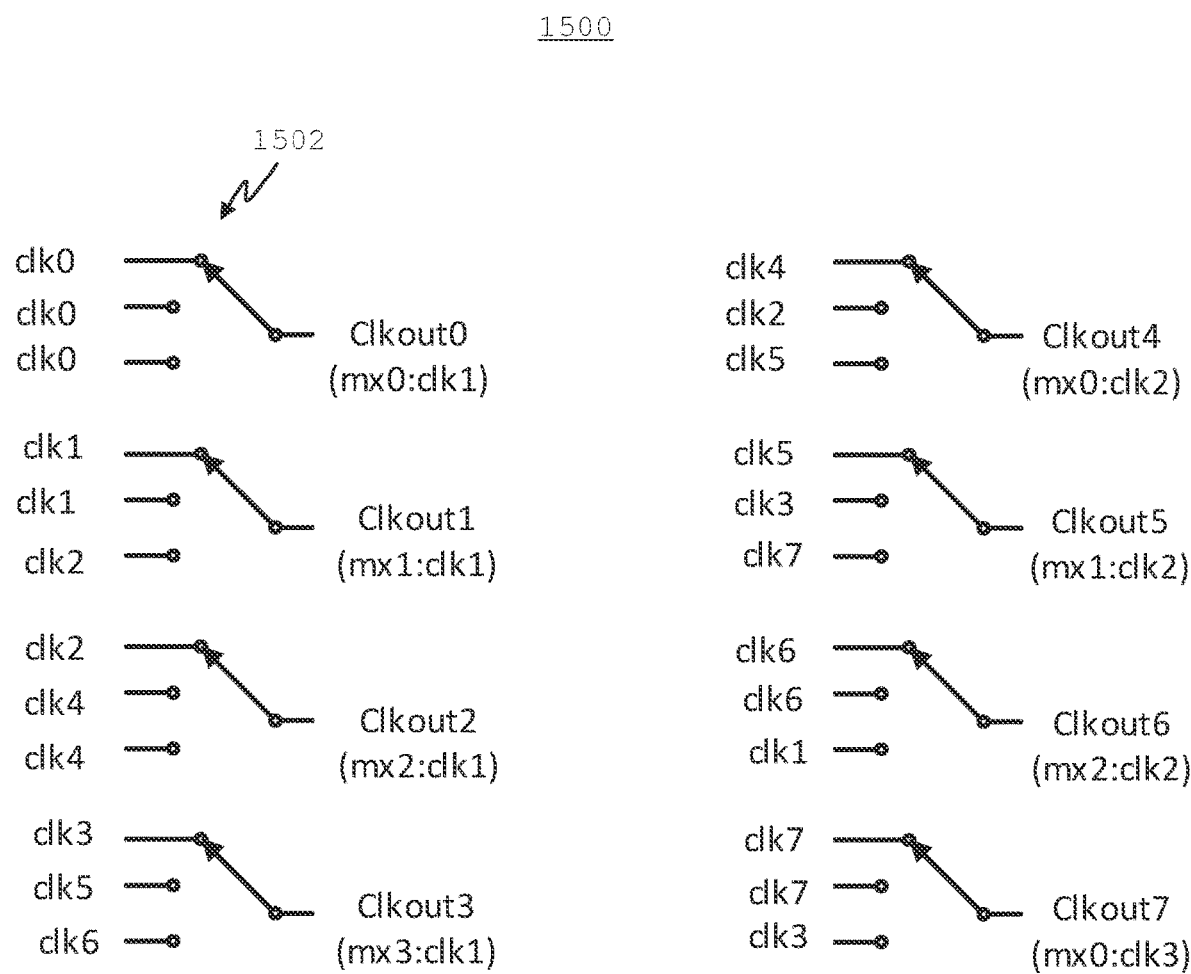

A non-limiting example embodiment of a clock distributor 1500 is shown in FIG. 15. It will be understood that any other switching implementations may be used to achieve the required clock signal distribution. In the example of FIG. 15 the clock distributor 1500 may include eight single pole three-way throw (SP3T) RF switches. Clock signals clk0-clk7 may originate from a clock generator, such as clock generation circuit 620 of FIG. 6A. Clock signals may be provided to the three throws of the SP3T switch 1502 as indicated in FIG. 15. Depending on the state of the SP3T switch 1502, one of the clock signals may be provided to the pole of the SP3T switch 1502 as Clkout0-Clkout7.

FIG. 16 shows an example clock distribution table 1600 for the clock distributor 1500 of FIG. 15. The input clocks indicate clock signals clk0-clk7 from the clock generator. The clock signals clk0-clk7 may have clock phases 0, 45, 90, 135, 180, 225, 270 and 316 degrees, respectively.

In the example of FIG. 6A the first input (depicted ck1) to the differential mixers 612-618 may be connected to Clkout0-Clkout3, respectively. The second input (depicted ck2) to the differential mixers 612-618 may be connected to Clkout4-Clkout7, respectively. Using the clock distributor 1500 in the HRM configuration shown in table 1600 results in a clock distribution for an HRM configuration similar to the HRM 100 of FIG. 1A. Using the clock distributor 1500 in the x2 SHM configuration shown in table 1600 results in a clock distribution for a x2 SHM configuration similar to the x2 SHM 200 of FIG. 2A. Using the clock distributor 1500 in the x4 SHM configuration shown in table 1600 results in a clock distribution for a x4 SHM configuration similar to the x4 SHM 400 of FIG. 4A.

Example Control of the Switches in the Differential Mixers

Figure 17:
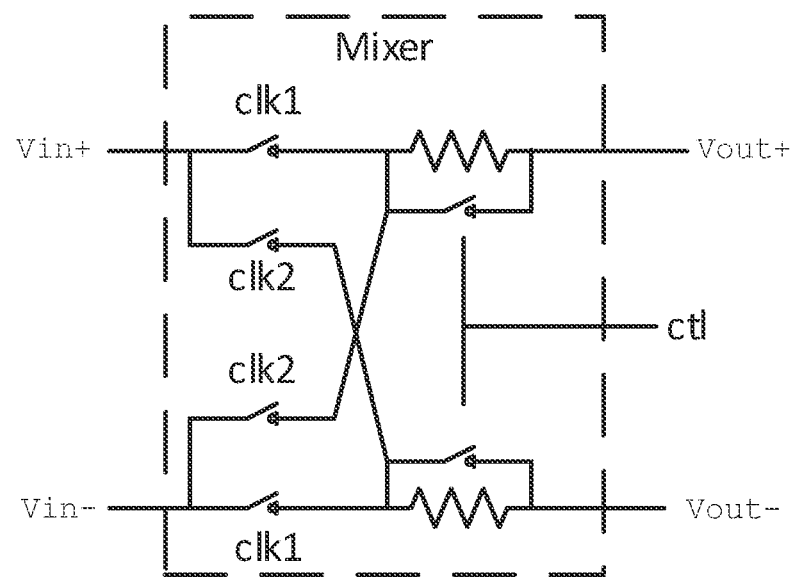
FIG. 17 illustrates control signals in a differential mixer in accordance with embodiments described herein.

In an example embodiment the switches in the differential mixers may be controlled as shown in FIG. 17. FIG. 17 shows a differential mixer 1700, similar to the differential mixer 1002 of FIG. 10.

The clock distribution may use two bits to control selection of different states of the clock distributor, e.g., for controlling the three states of a SP3T switch 1502 in the example of FIG. 15. A standard decoder may establish control of the three transmission gates shown in the clock distribution implementation of FIG. 15 from a two-bit input. The first and second clock inputs (depicted clk1 and clk2, similar to ck1 and ck2 in FIG. 6A) to the differential mixer 1700 may control the four switches to the left in the differential mixer 1700.

An HRM mode may be enabled by including the resistor of the differential mixer 1700 in the signal path by opening the two switches to the right in FIG. 17. A x2 SHM, a x3 SHM or a x4 SHM mode may be enabled by excluding the resistor of the differential mixer 1700 from the signal path by closing the two switches to the right in FIG. 17. This HRM control may be to two of the four differential mixers in FIG. 6A, e.g., the first and fourth differential mixer, as only these differential mixers include the resistor. The other two differential mixers may lack the internal transistors or be configured to always close the two switches. For symmetry purposes the same circuitry as shown for the differential mixer 1700 may be used on every mixer, but only two mixers require the resistor control. As the two resistor switches open and close at the same time, a single bit control signal (depicted ctl) may be used.

The decoder output that enables the HRM selection for the clock distribution may also be used for the switch around the resistor in the differential mixer 1700.

Example Application

Figure 18:
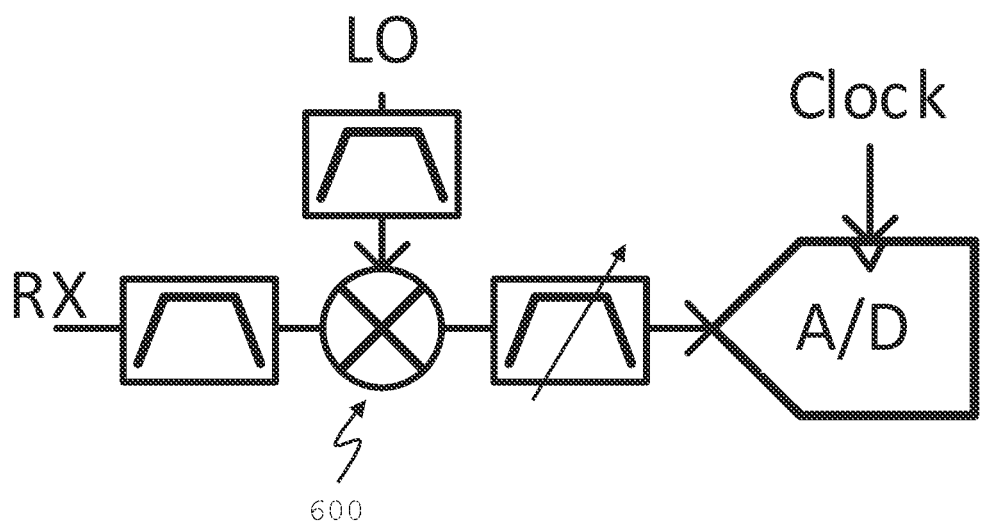
FIG. 18 illustrates an example of a part of an RF front end in accordance with embodiments described herein.

A reconfigurable HRM/SHM mixer, such as the reconfigurable HRM/SHM mixer 600 of FIG. 6A, may be used in an RF front end to extend receiver bands, e.g., to 50 GHz. An example of a system 500 of an RF front end that may be adapted to include a reconfigurable HRM/SHM mixer is shown in FIG. 5. Another example embodiment of a part 1800 of an RF front end is shown in FIG. 18. FIG. 18 shows an incoming receiver signal (depicted RX) that may be processed by one or more filters and input to a reconfigurable HRM/SHM mixer 600. The RX input to the reconfigurable HRM/SHM mixer 600 is depicted Vin+ and Vin− in FIG. 6A. An LO signal (depicted LO) may be processed by one or more further filters and input to the reconfigurable HRM/SHM mixer 600 to enable a clock generation circuit 620 to generate the clock signals in different phases. A clock distribution circuit 630 may distributed the clock signals to the differential mixers of the mixer core 610 to operate as one of an HRM, a x2 SHM, a x3 SHM or a x4 SHM. Output of the reconfigurable HRM/SHM mixer 600 may be filtered by one or more further filters and input to an analog/digital converter (depicted A/D), after which the signals may be further processed in a digital domain.

During operation of an RF front end, e.g., during operation of the system 500 shown in FIG. 5 when adapted to include a reconfigurable HRM/SHM mixer or during operation of the part 1800 of an RF front end shown in FIG. 18, the mode of operation may change by reconfiguring the reconfigurable HRM/SHM mixer 600.

In an example embodiment of the part 1800 of an RF front end shown in FIG. 18, the input RX signal may have a frequency in the range of 10 GHz-50 GHz. The input LO signal may have a frequency in the range of $LO_{min}$–$LO_{max}$=9 GHz-18 GHz. Harmonic rejections may occur below 18 GHz and the effective LO range may be larger than 50 GHz. In an example HRM mode the effective LO range may be 9 GHz-18 GHz, with lowest third harmonics at 27 GHz and lowest fifth harmonics at 45 GHz. In an example x2 SHM mode the effective LO range may be 18 GHz-36 GHz, with lowest third harmonics at 54 GHz. In an example x4 SHM mode the effective LO range may be 36 GHz-72 GHz, with lowest third harmonics at 108 GHz.

The reconfigurable HRM/SHM mixer 600 may thus operate with a reduced LO input range, but with a high side LO through 50 GHz. Moreover, odd order spurs may be reduced.

Example Method of Reconfiguring a Mixer
Topology as One of a HRM and a SHM

Figure 19:
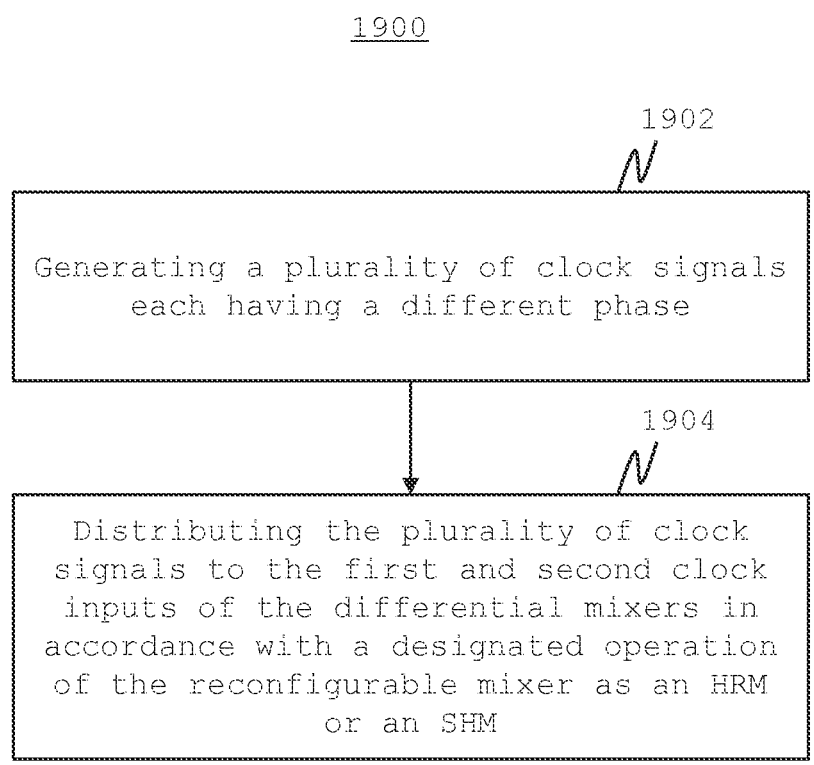
FIG. 19 shows a flow diagram of a method according to some embodiments.

FIG. 19 shows an example of a method 1900 of reconfiguring a mixer topology, such as the reconfigurable HRM/SHM mixer 600 of FIG. 6A, as an HRM or an SHM, such as a x2 SHM, a x3 SHM or a x4 SHM. In step 1902 a plurality of clock signals may be generated, each having a different phase. In step 1904 the plurality of clock signals may be distributed to the first and second clock inputs of the differential mixers in accordance with a designated operation of the reconfigurable mixer as an HRM or an SHM.

Select Examples

The following paragraphs provide various examples of the embodiments disclosed herein.

Example 1 provides a reconfigurable mixer topology for selectively implementing one of an HRM and an SHM. The reconfigurable mixer topology may include a mixer core. The mixer core may include a plurality of differential mixers each having a first clock input and a second clock input. The reconfigurable mixer topology may further include a clock generator for generating a plurality of clock signals each having a different phase. The reconfigurable mixer topology may further include clock distributor for distributing the plurality of clock signals to the first and second clock inputs of the differential mixers in accordance with a designated operation of the reconfigurable mixer as an HRM or an SHM.

Example 2 provides a reconfigurable mixer topology according to example 1, where the plurality of differential mixers may include four differential mixers and at least one resistor associated with at least one of the differential mixers.

Example 3 provides a reconfigurable mixer topology according to any one of the examples 1-2, where a designated operation of the reconfigurable mixer is as an HRM.

Example 4 provides a reconfigurable mixer topology according to any one of the examples 1-3, where for each of the differential mixers, the clock signals distributed to the first and second clock inputs thereof are 180 degrees out of phase from one another Example 5 provides a reconfigurable mixer topology according to any one of the examples 1-4, where a designated operation of the reconfigurable mixer is as an x2 SHM.

Example 6 provides a reconfigurable mixer topology according to any one of the examples 1-5, where the clock signals are distributed to only two selected ones of the four differential mixers and the at least one resistor is bypassed, and where the clock signals distributed to the first and second clock inputs of the two selected ones of the four differential mixers are 90 degrees out of phase from one another.

Example 7 provides a reconfigurable mixer topology according to any one of the examples 1-6, where a designated operation of the reconfigurable mixer is as an x3 SHM Example 8 provides a reconfigurable mixer topology according to any one of the examples 1-7, where the clock signals are distributed to only three selected ones of the four differential mixers, the second one of the three selected ones of the four differential mixers being inverted from the first and third ones of the three selected ones of the four differential mixers, and the at least one resistor is bypassed, and where the clock signals distributed to the first and second clock inputs of the three selected ones of the four differential mixers are 180 degrees out of phase from one another.

Example 9 provides a reconfigurable mixer topology according to any one of the examples 1-8, wherein a designated operation of the reconfigurable mixer is as an x4 SHM.

Example 10 provides a reconfigurable mixer topology according to any one of the examples 1-9, wherein the at least one resistor is bypassed, and where the clock signals distributed to the first and second clock inputs of the four differential mixers are 225 degrees out of phase from one another.

Example 11 provides a reconfigurable mixer topology according to any one of the examples 1-10, where the plurality of differential mixers are passive mixers.

Example 12 provides a reconfigurable mixer topology according to any one of the examples 1-11, where the plurality of differential mixers are active mixers.

Example 13 provides a reconfigurable mixer topology according to any one of the examples 1-12, where each of the active mixers includes a Gilbert cell topology.

Example 14 provides a system that may include a power divider and a configurable HRM/SHM mixer core. The system may further include a power combiner. The system may further include a tunable bandpass filter. The configurable HRM/SHM mixer core may include a plurality of differential mixers each having a first clock input and a second clock input. The configurable HRM/SHM mixer core may further include a clock distributor for distributing a plurality of clock signals to the first and second clock inputs of the differential mixers in accordance with a designated operation of the reconfigurable mixer as an HRM or an SHM.

Example 15 provides a system according to example 14, where the system may further include an in-phase and quadrature phase (I/Q) based signal path. The configurable HRM/SHM mixer core may include a first configurable HRM/SHM mixer core in an I-signal path and a second configurable HRM/SHM mixer core in a Q-signal path.

Example 16 provides a method of reconfiguring a mixer topology as one of an HRM and an SHM. The mixer topology may include a mixer core. The mixer core may include a plurality of differential mixers each having a first clock input and a second clock input. The method may include generating a plurality of clock signals each having a different phase. The method may further include distributing the plurality of clock signals to the first and second clock inputs of the differential mixers in accordance with a designated operation of the reconfigurable mixer as an HRM or an SHM.

Example 17 provides a method according to example 16, where the mixer core may include four differential mixers and at least one resistor associated with at least one of the differential mixers. The plurality of clock signals distributed to the first and second clock inputs of the differential mixers may be 180 degrees out of phase from one another. The mixer topology may thus be reconfigured as an HRM.

Example 18 provides a method according to any one of the examples 16-17, where the mixer core may include four differential mixers and at least one resistor associated with at least one of the differential mixers. The plurality of clock signals may be distributed to only two selected ones of the four differential mixers and the at least one resistor may be bypassed. The clock signals distributed to the first and second clock inputs of the two selected ones of the four differential mixers may be 90 degrees out of phase from one another. The mixer topology may thus be reconfigured as a x2 SHM.

Example 19 provides a method according to any one of the examples 16-18, where the mixer core may include four differential mixers and at least one resistor associated with at least one of the differential mixers. The plurality of clock signals may be distributed to only three selected ones of the four differential mixers, the second one of the three selected ones of the four differential mixers being inverted from the first and third ones of the three selected ones of the four differential mixers, and the at least one resistor may be bypassed. The clock signals distributed to the first and second clock inputs of the three selected ones of the four differential mixers may be 180 degrees out of phase from one another. The mixer topology may thus be reconfigured as a x3 SHM.

Example 20 provides a method according to any one of the examples 16-19, where the mixer core may include four differential mixers and at least one resistor associated with at least one of the differential mixers, where the at least one resistor may be bypassed. The clock signals distributed to the first and second clock inputs of the four differential mixers may be 225 degrees out of phase from one another. The mixer topology may thus be reconfigured as a x4 SHM.

Other Implementation Notes, Variations, and Applications

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

It is also imperative to note that all of the specifications, dimensions, and relationships outlined herein (e.g., the number of modules/systems, logic operations, etc.) have only been offered for purposes of example and teaching only. Such information may be varied considerably without departing from the spirit of the present disclosure, or the scope of the appended claims. The specifications apply only to some non-limiting examples and, accordingly, they should be construed as such. In the foregoing description, example embodiments have been described with reference to particular arrangements of components. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system may be consolidated in any suitable manner. Along similar design alternatives, any of the illustrated components, modules, and elements of the figures may be combined in various possible configurations, all of which are clearly within the broad scope of this specification. In certain cases, it may be easier to describe one or more of the functionalities of a given set of flows by only referencing a limited number of electrical elements. It should be appreciated that the electrical circuits of the figures and its teachings are readily scalable and may accommodate a large number of components, as well as more complicated/sophisticated arrangements and configurations. Accordingly, the examples provided should not limit the scope or inhibit the broad teachings of the electrical circuits as potentially applied to myriad other architectures.

Note that with the numerous examples provided herein, interaction may be described in terms of two, three, four, or more components. However, this has been done for purposes of clarity and example only. It should be appreciated that the system can be consolidated in any suitable manner. Along similar design alternatives, any of the illustrated components, modules, and elements of the drawings may be combined in various possible configurations, all of which are clearly within the broad scope of the present disclosure.

It should also be noted that in this specification, references to various features (e.g., elements, structures, modules, components, steps, operations, characteristics, etc.) included in "one embodiment", "exemplary embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It should also be noted that the functions related to circuit architectures illustrate only some of the possible circuit architecture functions that may be executed by, or within, systems illustrated in the figures. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the device and system described above may also be implemented with respect to the method or process described herein and specifics in the examples may be used anywhere in one or more embodiments.

The 'means for' in these instances (above) may include (but is not limited to) using any suitable component discussed herein, along with any suitable software, circuitry, hub, computer code, logic, algorithms, hardware, controller, interface, link, bus, communication pathway, etc.

Note that with the example provided above, as well as numerous other examples provided herein, interaction may be described in terms of two, three, or four network elements. However, this has been done for purposes of clarity and example only. In certain cases, it may be easier to describe one or more of the functionalities of a given set of flows by only referencing a limited number of network elements. It should be appreciated that topologies illustrated in and described with reference to the accompanying figures (and their teachings) are readily scalable and may accommodate a large number of components, as well as more complicated/sophisticated arrangements and configurations. Accordingly, the examples provided should not limit the scope or inhibit the broad teachings of the illustrated topologies as potentially applied to myriad other architectures.

It is also important to note that the steps in the preceding flow diagrams illustrate only some of the possible signaling scenarios and patterns that may be executed by, or within, communication systems shown in the figures. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by communication systems shown in the figures in that any suitable arrangements, chronologies, configurations, and timing mechanisms may be provided without departing from the teachings of the present disclosure.

Although the present disclosure has been described in detail with reference to particular arrangements and configurations, these example configurations and arrangements may be changed significantly without departing from the scope of the present disclosure. For example, although the present disclosure has been described with reference to particular communication exchanges, embodiments described herein may be applicable to other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 142 as it exists on the date of the filing hereof unless the words "means for" or "step for" are specifically used in the particular claims; and (b) does not intend, by any statement in the specification, to limit this disclosure in any way that is not otherwise reflected in the appended claims.

The invention claimed is:

1. A reconfigurable mixer topology for implementing one of a harmonic rejection mixer (HRM) and a subharmonic mixer (SHM) according to a designated mode of operation, the reconfigurable mixer topology comprising:
   a mixer core comprising a plurality of differential mixers each having a first clock input and a second clock input;
   a clock generator to generate a plurality of clock signals having respective specified phases relative to each other;
   a clock distributor to distribute the plurality of clock signals to the first and second clock inputs of the differential mixers in accordance with the designated mode of operation of the reconfigurable mixer topology as the HRM or the SHM according to a selection of an HRM mode or an SHM mode; and
   at least one resistor associated with at least one of the differential mixers, the at least one resistor bridged by a switch; and
   wherein a state of the switch is controlled according to the designated mode of operation.

2. The reconfigurable mixer topology according to claim 1, wherein the plurality of differential mixers comprises four differential mixers.

3. The reconfigurable mixer topology according to claim 2, wherein a designated mode of operation of the reconfigurable mixer is the HRM mode.

4. The reconfigurable mixer topology according to claim 3, wherein for each of the differential mixers, the clock signals distributed to the first and second clock inputs thereof are 180 degrees out of phase from one another.

5. The reconfigurable mixer topology according to claim 2, wherein the designated mode of operation of the reconfigurable mixer is as an x2 SHM.

6. The reconfigurable mixer topology according to claim 5, wherein the clock signals are distributed to only two selected ones of the four differential mixers and the at least one resistor is bypassed using the switch, and
wherein the clock signals distributed to the first and second clock inputs of the two selected ones of the four differential mixers are 90 degrees out of phase from one another.

7. The reconfigurable mixer topology according to claim 2, wherein the designated mode of operation of the reconfigurable mixer is as an x3 SHM.

8. The reconfigurable mixer topology according to claim 7, wherein the clock signals are distributed to only three selected ones of the four differential mixers, a second one of the three selected ones of the four differential mixers being inverted from first and third ones of the three selected ones of the four differential mixers, and the at least one resistor is bypassed using the switch, and
wherein the clock signals distributed to the first and second clock inputs of the three selected ones of the four differential mixers are 180 degrees out of phase from one another.

9. The reconfigurable mixer topology according to claim 2, wherein the designated mode of operation of the reconfigurable mixer is as an x4 SHM.

10. The reconfigurable mixer topology according to claim 9, wherein the at least one resistor is bypassed using the switch, and wherein the clock signals distributed to the first and second clock inputs of the four differential mixers are 225 degrees out of phase from one another.

11. The reconfigurable mixer topology according to claim 2, wherein the plurality of differential mixers are passive mixers.

12. The reconfigurable mixer topology according to claim 1, wherein the plurality of differential mixers are active mixers.

13. The reconfigurable mixer topology according to claim 12, wherein each of the active mixers comprises a Gilbert cell topology.

14. A system comprising a power divider, a configurable harmonic rejection mixer (HRM)/subharmonic mixer (SHM) mixer core, a power combiner and a tunable bandpass filter, wherein the configurable HRM/SHM mixer core comprises:
a plurality of differential mixers each having a first clock input and a second clock input;
a clock distributor to distribute a plurality of clock signals to the first and second clock inputs of the differential mixers in accordance with a designated mode of operation of the configurable HRM/SHM mixer core as an HRM or an SHM; and
at least one resistor associated with at least one of the differential mixers, the at least one resistor bridged by a switch; and
wherein a state of the switch is controlled according to the designated mode of operation.

15. The system according to claim 14, comprising an in-phase and quadrature phase (I/Q) based signal path, and wherein the configurable HRM/SHM mixer core comprises a first configurable HRM/SHM mixer core in an I-signal path and a second configurable HRM/SHM mixer core in a Q-signal path.

16. A method of reconfiguring a mixer topology as implementing one of a harmonic rejection mixer (HRM) and a subharmonic mixer (SHM) according to a designated mode of operation,
wherein the mixer topology comprises a mixer core comprising a plurality of differential mixers each having a first clock input and a second clock input, and at least one resistor associated with at least one of the differential mixers, the at least one resistor bridged by a switch, the method comprising:
generating a plurality of clock signals each having a different phase; and
distributing the plurality of clock signals to the first and second clock inputs of the differential mixers in accordance with the designated mode of operation of the mixer topology as the HRM or the SHM;
wherein a state of the switch is controlled according to the designated mode of operation.

17. The method according to claim 16, wherein the mixer core comprises four differential mixers, and
wherein the plurality of clock signals distributed to the first and second clock inputs of the differential mixers are 180 degrees out of phase from one another.

18. The method according to claim 16, wherein the mixer core comprises four differential mixers,
wherein the plurality of clock signals are distributed to only two selected ones of the four differential mixers and the at least one resistor is bypassed using the switch, and
wherein the clock signals distributed to the first and second clock inputs of the two selected ones of the four differential mixers are 90 degrees out of phase from one another.

19. The method according to claim 16, wherein the mixer core comprises four differential mixers,
wherein the plurality of clock signals are distributed to only three selected ones of the four differential mixers, a second one of the three selected ones of the four differential mixers being inverted from first and third ones of the three selected ones of the four differential mixers, and the at least one resistor is bypassed using the switch, and
wherein the clock signals distributed to the first and second clock inputs of the three selected ones of the four differential mixers are 180 degrees out of phase from one another.

20. The method according to claim 16, wherein the mixer core comprises four differential mixers,
wherein the at least one resistor is bypassed using the switch, and wherein the clock signals distributed to the first and second clock inputs of the four differential mixers are 225 degrees out of phase from one another.

* * * * *